(12) United States Patent
Scheller et al.

(10) Patent No.: US 11,563,137 B2
(45) Date of Patent: Jan. 24, 2023

(54) OPTICAL TRANSFORMER

(71) Applicant: Meta Platforms Technologies, LLC, Menlo Park, CA (US)

(72) Inventors: Maik Andre Scheller, Redmond, WA (US); Andrew John Ouderkirk, Redmond, WA (US); Jonathan Robert Peterson, Woodinville, WA (US); Daniele Piazza, Redmond, WA (US); Jeremy Thomas Braun, Seattle, WA (US); Kenneth Diest, Kirkland, WA (US); Spencer Allan Wells, Seattle, WA (US); Renate Eva Klementine Landig, Seattle, WA (US); Liliana Ruiz Diaz, Menlo Park, CA (US); Tanya Malhotra, Redmond, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 595 days.

(21) Appl. No.: 16/594,346

(22) Filed: Oct. 7, 2019

(65) Prior Publication Data

US 2021/0083141 A1    Mar. 18, 2021

Related U.S. Application Data

(60) Provisional application No. 62/900,672, filed on Sep. 16, 2019.

(51) Int. Cl.
*H01L 31/167* (2006.01)
*H02N 2/04* (2006.01)
(Continued)

(52) U.S. Cl.
CPC ......... *H01L 31/167* (2013.01); *H01L 31/044* (2014.12); *H01L 31/0504* (2013.01); *H02N 2/04* (2013.01)

(58) Field of Classification Search
CPC . H01L 31/167; H01L 31/044; H01L 31/0504; H02N 2/04
(Continued)

(56) References Cited

U.S. PATENT DOCUMENTS 4,730,115 A * 3/1988 Abe ..................... H01L 31/167
257/E31.107
5,248,931 A * 9/1993 Flesner .................. H02S 99/00
323/906

(Continued)

FOREIGN PATENT DOCUMENTS

| DE | 102019103805 A1 | 8/2020 |
| FR | 2 525 831 A1 | 10/1983 |
| JP | 2002034176 A | 1/2002 |

OTHER PUBLICATIONS

Silvestre et al., "Study of bypass diodes configuration on PV modules", Applied Energy, vol. 86, Issue 9, 2009, pp. 1632-1640.
(Continued)

*Primary Examiner* — Tomi Skibinski
(74) *Attorney, Agent, or Firm* — Greenberg Traurig, LLP

(57) ABSTRACT

An optical transformer includes a light source and an array of photovoltaic cells optically coupled to the light source, where at least a portion of the photovoltaic cells are connected in series. An optical connector such as a waveguide or an optical fiber may be disposed between an output of the light source and an input of the array of photovoltaic cells. Configured to generate a high voltage output, the optical transformer may be configured to power a device such as an actuator that provides a tunable displacement as a function of voltage.

20 Claims, 13 Drawing Sheets

(51) Int. Cl.
*H01L 31/044* (2014.01)
*H01L 31/05* (2014.01)

(58) Field of Classification Search
USPC .......................................................... 310/311
See application file for complete search history.

(56) References Cited

U.S. PATENT DOCUMENTS

| | | | |
|---|---|---|---|
| 6,265,653 | B1 | 7/2001 | Haigh et al. |
| 6,304,428 | B1 | 10/2001 | Sato |
| 6,316,715 | B1 | 11/2001 | King et al. |
| 6,359,210 | B2 | 3/2002 | Ho et al. |
| 7,941,022 | B1 | 5/2011 | Schaffner et al. |
| 10,499,466 | B1 | 12/2019 | Miskin et al. |
| 2002/0153037 | A1 | 10/2002 | Fischer |
| 2010/0189134 | A1 | 7/2010 | Ying |
| 2011/0209761 | A1 | 9/2011 | Counil et al. |
| 2013/0119409 | A1 | 5/2013 | Zhao |
| 2014/0061679 | A1* | 3/2014 | Guo ................ H01L 31/173 257/84 |
| 2017/0083095 | A1 | 3/2017 | Lee et al. |

OTHER PUBLICATIONS

Helmers H., et al., "Photovoltaic Cells with Increased Voltage Output for Optical Power Supply of Sensor Electronics," 7th International Conference on Sensors and Measurement Technology, May 2015, 6 pages.

International Search Report and Written Opinion for International Application No. PCT/US2021/046057, dated Nov. 15, 2021, 11 pages.

"Opto-Isolator—Wikipedia," May 5, 2018, XP055857857, [Retrieved on Nov. 18, 2021], 4 pages, Retrieved from the Internet: https://en.wikipedia.org/wiki/Optical_isolator.

International Search Report and Written Opinion received for PCT Application Serial No. PCT/US2020/047557 dated Nov. 11, 2020, 11 pages.

Non-Final Office Action dated Dec. 27, 2021 for U.S. Appl. No. 16/841,519, filed Apr. 6, 2020, 15 pages.

Final Office Action dated Mar. 14, 2022 for U.S. Appl. No. 16/841,519, filed Apr. 6, 2020, 20 pages.

Notice of Allowance dated Apr. 20, 2022 for U.S. Appl. No. 16/996,588, filed Aug. 18, 2020, 09 pages.

Restriction Requirement dated Aug. 20, 2021 for U.S. Appl. No. 16/841,519, filed Apr. 6, 2020, 9 Pages.

International Preliminary Report on Patentability for International Application No. PCT/US2020/047557, dated Mar. 31, 2022, 9 pages.

Non-Final Office Action dated Jul. 28, 2022 for U.S. Appl. No. 16/841,519, filed Apr. 6, 2020, 21 pages.

Notice of Allowance dated Jul. 29, 2022 for U.S. Appl. No. 16/996,588, filed Aug. 18, 2020, 2 pages.

* cited by examiner

OPTICAL TRANSFORMER

CROSS-REFERENCE TO RELATED APPLICATION

This application claims the benefit of priority under 35 U.S.C. § 119(e) of U.S. Provisional Application No. 62/900,672, filed Sep. 16, 2019, the contents of which are incorporated herein by reference in their entirety.

BRIEF DESCRIPTION OF THE DRAWINGS

The accompanying drawings illustrate a number of exemplary embodiments and are a part of the specification. Together with the following description, these drawings demonstrate and explain various principles of the present disclosure.

Figure 1:
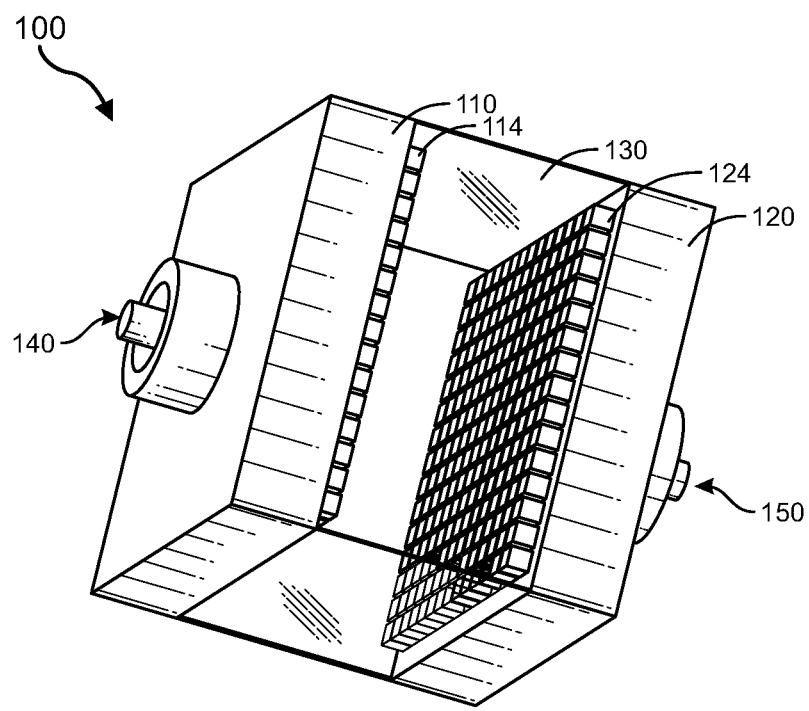
FIG. 1 is a schematic illustration of an example optical transformer according to various embodiments.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the present disclosure covers all modifications, equivalents, and alternatives falling within the scope of the appended claims.

DETAILED DESCRIPTION OF EXEMPLARY EMBODIMENTS

High voltages may be used to power a variety of different devices and systems, including high voltage relays, cathode ray tubes, e.g., to generate x-rays and particle beams, and piezoelectric actuators, e.g., to manipulate the focal length of variable focal length lenses. In this regard, a voltage transformer may be employed to increase voltage output where the generated voltage of a device or system is otherwise insufficient. Many voltage transformers, including step-up converters (booster converters) and piezo-transformers, for example, may be configured to convert relatively low DC input voltages (~1V-2V) to output voltages greater than 1 kV. However, the design of many such voltage transformers, including the requisite inductors and capacitors, may unduly increase the size of the device (e.g., to 1 cm$^3$ and greater), which may be excessive for many applications, including wearable devices. Thus, notwithstanding recent developments, it would be advantageous to provide an economical high voltage source having a compact footprint.

The present disclosure is generally directed to voltage transformers, and more specifically to optical transformers that include an integrated array of monolithic photovoltaic cells connected in series. In certain embodiments, micrometer-scale photovoltaic cells may be arrayed to form an optical transformer having commercially-relevant dimensions. For example, in combination with a light source powered by a DC voltage source, an optical transformer (DC to DC converter) may exhibit a footprint of less than approximately 5 mm$^3$. Example optical transformers may be configured to provide scalable output, i.e., open-circuit voltages from approximately 1V to greater than approximately 1 kV, e.g., 1, 2, 5, 10, 20, 50, 100, 200, 500, or 1000 V or more, including ranges between any of the foregoing values.

In certain embodiments, an optical transformer may include a light source and an array of photovoltaic cells optically coupled to the light source, where at least a portion of the photovoltaic cells are connected in series.

By way of example, the light source may include a surface-emitting device, e.g., a top- or bottom-emitting device such as a vertical cavity surface emitting laser (VCSEL), a vertical external cavity surface emitting laser (VECSEL), or a light-emitting diode (LED) such as an organic light emitting diode (OLED) or a resonant cavity light emitting diode (RCLED). In some embodiments, the light source may include an edge-emitting device, e.g., a laser diode or a superluminescent diode (SLED). In certain embodiments, the light source may include a single emitter or a plurality of emitters in an addressable array.

By way of example, a light source including a laser diode or a light emitting diode may include an indirect bandgap semiconductor or a direct bandgap semiconductor, such as Si, GaAs, InGaAs, AlGaAs, GaN, InGaN, AlGaN, GaP, GaAsP, AlGaInP, and the like. In some embodiments, the light source may include one or more optical elements configured to enhance light extraction and focusing efficiency, such as one or more micro lenses, total internal reflection (TIR) concentrators and/or total internal reflection-refraction (TIR-R) concentrators.

According to certain embodiments, the optical power generation of the light source and hence the output voltage of the optical transformer may be controlled by voltage or current modulation. Such modulation may be analog (e.g., current amplitude modulation) or digital (e.g., pulse width modulation). A PID control circuit may be used to control the modulation and stabilize the output voltage.

The light source may be configured to illuminate one or more photovoltaic cells within a photovoltaic cell array. Example photovoltaic cells may use a p-n junction (or p-i-n-junction) within a semiconductor to obtain a current from photons absorbed near the junction. As a direct bandgap material, gallium arsenide (GaAs) is highly absorbing to photons having an energy greater than its bandgap ($E_g$). Further example direct bandgap semiconductors include InGaAs, AlGaAs, GaN, InGaN, AlGaN, GaP, GaAsP, AlGaInP, and the like. In alternate embodiments, the photovoltaic cells may be manufactured from an indirect bandgap semiconductor such as silicon (Si). For instance, an example monolithic integrated micro photovoltaic cell array may include silicon, where the p-n junctions (or p-i-n junctions) may be formed by lateral doping profiles.

An alternate approach to the development of a photovoltaic cell array is through the use of metal-semiconductor Schottky barriers to replace the semiconductor-semiconductor p-n junctions. Schottky barriers may be adaptable to economical, versatile manufacturing techniques and are suitable for polycrystalline-based devices. Additionally, since the collecting junction is located at the surface of the device, the collection efficiency through decreased surface recombination may be improved relative to a p-n junction. According to still further embodiments, the photovoltaic cells may include quantum dots or a quantum well. As will be appreciated, the bandgap of a quantum dot may be adjusted through a wide range of energy levels by changing the size of the dot.

As disclosed herein, plural photovoltaic cells within an array may be at least partially connected in series. In some embodiments, groups of cells may be connected in parallel to control (e.g., increase) the output current. That is, a photovoltaic cell array may include sub-arrays respectively configured in series and in parallel. Moreover, according to some embodiments, individual photovoltaic cells may be illuminated selectively to control the output voltage of the optical transformer. In certain embodiments, to improve the light absorption efficiency, the light source may have an emission spectrum selected to overlap the absorption profile of the photovoltaic cells.

The photovoltaic cell array may further include one or more bypass diodes, which may be connected in parallel to an individual cell or groups of cells to enable current flow through (around) unilluminated or damaged cells. Such bypass diodes may be integrated during wafer-level processing of the photodiodes or connected to the array as discrete elements.

In some embodiments, individual photovoltaic cells may include a compound semiconductor and may be formed en masse during wafer-level processing. Alternatively, individual photovoltaic cells may be formed separately and then transferred (e.g., by pick-and-place or wafer bonding) to a carrier substrate.

In some embodiments, the light source and the photovoltaic cell array may be in direct contact. In some embodiments, an optical connector may be disposed between the light source and the photovoltaic cell array to guide emitted light from the light source to the photovoltaic cells within the array. An optical connector may include any material suitable for guiding light, including glass, polymer, and/or semiconductor compositions. The optical connector may include crystalline or amorphous materials, for example. In some embodiments, the optical connector may include a gas or a liquid. The optical connector may be electrically insulating. To inhibit reflective losses, in certain embodiments, the optical connector may be characterized by a refractive index of at least 1.5.

In some embodiments, the light source may include N emitters and the photovoltaic cell array may include N corresponding photovoltaic cells. In further embodiments, the number of emitters may exceed the number of photovoltaic cells. In still further embodiments, the number of photovoltaic cells may exceed the number of emitters. The optical connector may further include a micro lens array or other elements configured to focus emitted light onto individual photovoltaic cells, e.g., onto a center of respective photovoltaic cells.

Features from any of the embodiments described herein may be used in combination with one another in accordance with the general principles described herein. These and other embodiments, features, and advantages will be more fully understood upon reading the following detailed description in conjunction with the accompanying drawings and claims.

The following will provide, with reference to FIGS. 1-17, detailed descriptions of optical transformers, i.e., optically-driven voltage converters, as well as devices and systems using such optical transformers. The discussion associated with FIG. 1 includes a description of an example optical transformer. The discussion associated with FIGS. 2-5 includes a description of various components of an optical transformer. The discussion associated with FIGS. 6 and 7 includes a description of example configurations of a photovoltaic cell array. The discussion associated with FIG. 8 includes a description of an example photovoltaic cell architecture. The discussion associated with FIG. 9 includes a description of an addressable light source and a corresponding photovoltaic cell array. The discussion associated with FIGS. 10 and 11 includes a description of example high voltage devices. The discussion associated with FIGS. 12-17 relates to exemplary virtual reality and augmented reality device architectures that may include an optical transformer as disclosed herein.

Referring to FIG. 1, shown is a perspective view of an example optical transformer. Optical transformer 100 may include a light emitter 110, a photovoltaic cell array 120 facing the light emitter 110, and an optical connector 130 disposed between the light emitter 110 and the photovoltaic cell array 120. In certain embodiments, the optical transformer 100 may further include a cooling element (not shown), such as an active cooling element or a passive cooling element adapted to control the temperature during use of one or more of the light emitter 110 and the photovoltaic cell array 120.

Light emitter 110 may include an array of individual emitters 114 and may be powered with a voltage source 140. In certain embodiments, light emitter 110 may include a laser or a light-emitting diode. Example lasers may include a vertical cavity surface emitting laser (VCSEL) or a vertical external cavity surface emitting laser (VECSEL). A light-emitting diode (LED) may include an organic light emitting diode (OLED) or a resonant cavity light emitting diode (RCLED).

An OLED device, for instance, may include, from bottom to top, a glass substrate, a conducting anode such as indium tin oxide (ITO), a stack of organic layers, and a cathode layer. In certain examples, the device may include a transparent anode and a reflective cathode layer such that light generated by the device may be emitted through the substrate, i.e., a bottom-emitting device. In further examples, the OLED device may include a reflective anode and a transparent cathode such that light generated by the device may be emitted through the top transparent electrode, i.e., a top-emitting device.

Light emitter 110 may be configured to emit photons that may be guided through the optical connector 130 to the photovoltaic cell array 120. The optical connector 130 may include a waveguide, for example, such as a planar waveguide. In certain embodiments, the optical connector 130 may include a dimmer unit, which may be adapted to tune the output voltage of the optical transformer, e.g., to finer increments.

According to some embodiments, light emitter 110 may emit electromagnetic radiation having a wavelength of from approximately 10 nm to approximately 1 mm, e.g., 10 nm, 20 nm, 50 nm, 100 nm, 200 nm, 300 nm, 400 nm, 500 nm, 600 nm, 700 nm, 800 nm, 900 nm, 1 µm, 2 µm, 5 µm, 10 µm, 20 µm, 50 µm, 100 µm, 200 µm, 500 µm, or 1000 µm, including ranges between any of the foregoing values.

Photovoltaic cell array 120 may include a plurality of individual photovoltaic elements 124, at least a portion of which may be interconnected in series. Example photovoltaic cell arrays may include at least approximately 25 photovoltaic cells, e.g., 25, 50, 75, 100, or 200 or more photovoltaic cells, including ranges between any of the foregoing values. As will be appreciated, by arranging at least a portion of the photovoltaic cells 124 in series, the output voltage 150 of the array 120 may be greater than the open circuit voltage of an individual element 124. For instance, the open circuit voltage of an array of N photovoltaic elements may be approximately N times the open circuit voltage of an individual photovoltaic element within the array. As used herein, the term "open circuit voltage" may, in some examples, refer to the electrical potential difference between two terminals of a device when disconnected from any circuit, i.e., the voltage in the absence of an external load.

In the illustrated embodiment, the light emitter 110 and the photovoltaic cell array 120 each present a planar geometry. According to further embodiments, either or both of the light emitter 110 and the photovoltaic cell array 120 may include a non-planar surface, such as a convex surface or a concave surface.

Figure 2:
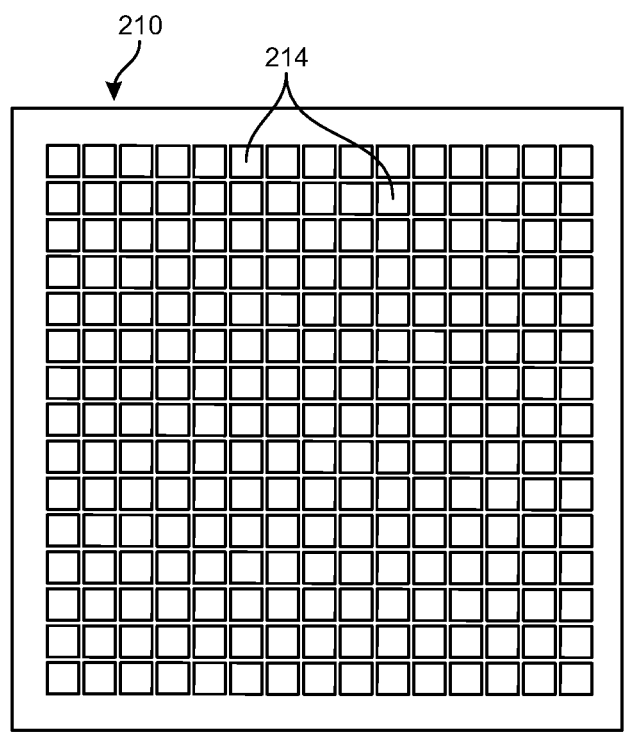
FIG. 2 shows a vertical cavity surface emitting laser array operable as a light source for an optical transformer in accordance with some embodiments.

According to some embodiments, as disclosed herein, the light emitter 110 may include a laser. Referring to FIG. 2, an example light emitter may include a vertical-cavity surface-emitting laser (VCSEL) array 210. The VCSEL array 210 may include a square array of individual emitters 214 that may be connected in parallel or, according to some embodiments, addressed individually. In embodiments where the light emitter 110 includes a laser, the optical transformer may further include an optical insulator unit (not shown) to suppress instabilities associated with the laser.

Figure 3:
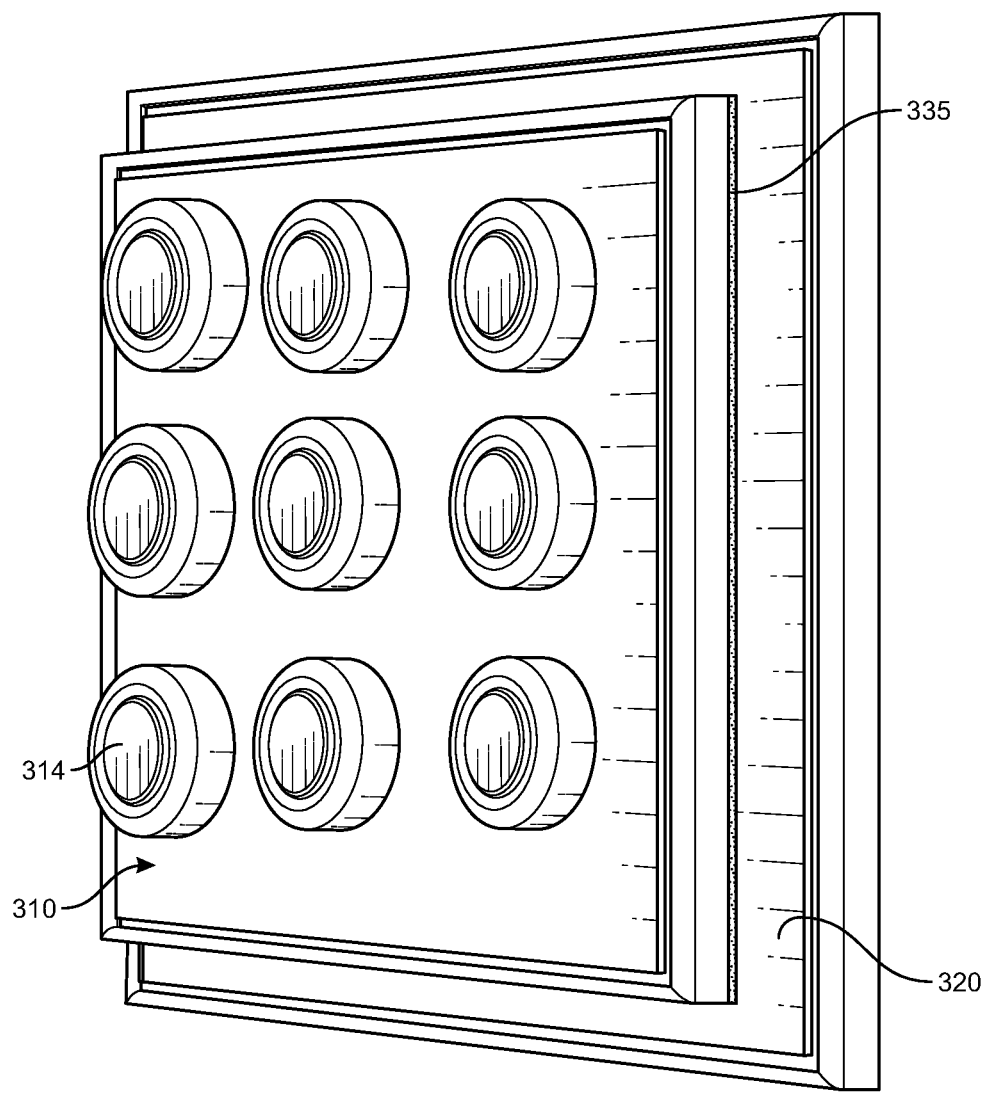
FIG. 3 shows a vertical cavity surface emitting laser array having individual emitters in direct contact with a bottom absorbing photovoltaic cell array according to some embodiments.

According to further embodiments, an example bottom-emitting light source is shown in FIG. 3. Light source (e.g., VCSEL array) 310, which includes a plurality of individual emitters 314, may be in direct contact with a bottom-absorbing photovoltaic cell array 320. In certain embodiments, as illustrated, a transparent adhesive layer 335 may be disposed between the light source 310 and the photovoltaic cell array 320. Transparent adhesive layer 335 may be configured to mitigate reflective losses between the light source 310 and the photovoltaic cell array 320.

Figure 4:
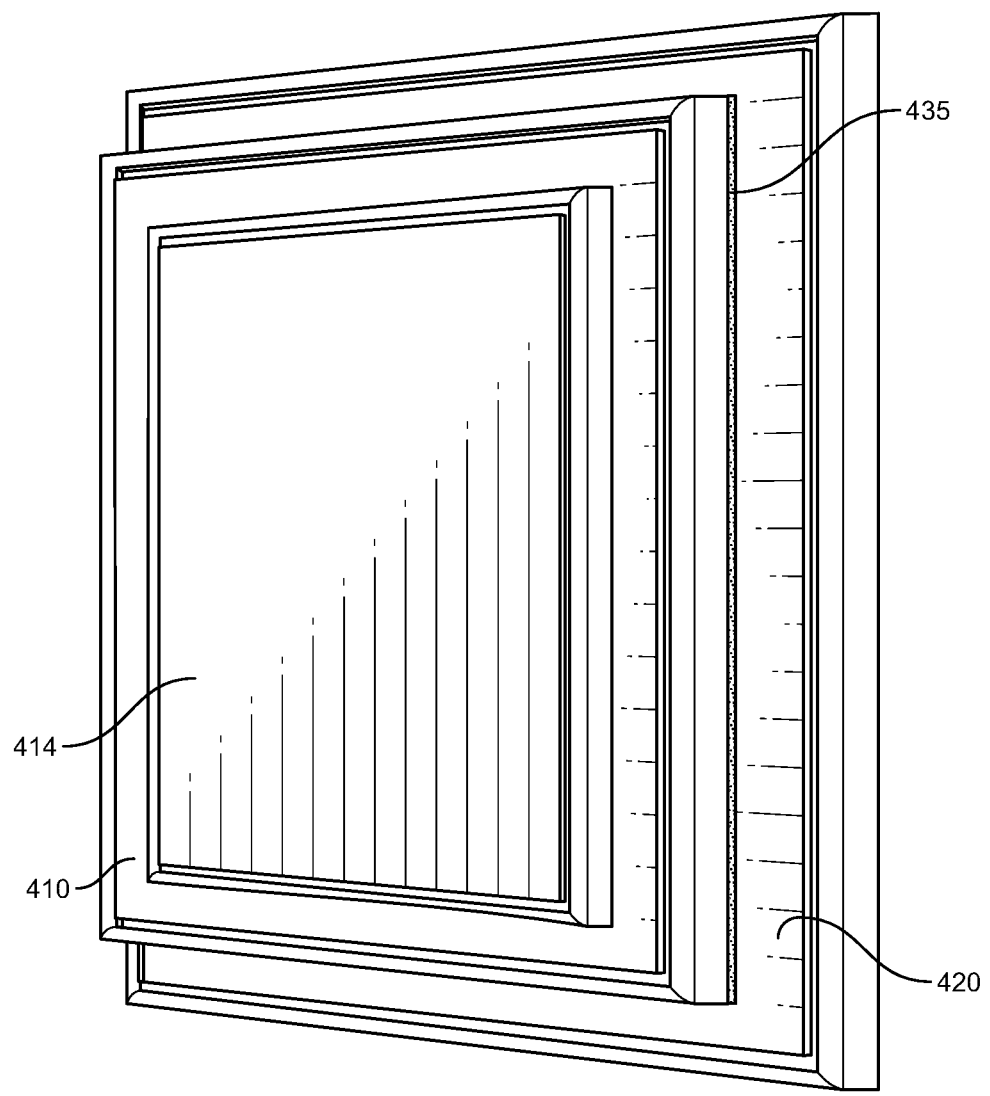
FIG. 4 shows a bottom emitting light source having a single emitter in contact with a bottom absorbing photovoltaic cell array according to certain embodiments.

A further example light source is shown in FIG. 4. In the example embodiment of FIG. 4, bottom-emitting light source (e.g., LED) 410 may include a single emitter 414 and may be bonded to a bottom-absorbing photovoltaic cell array 420 via a transparent adhesive layer 435. In alternate embodiments, the transparent adhesive layer 435 may be omitted such that the light source 410 may be in direct contact with the photovoltaic cell array 420.

Figure 5:
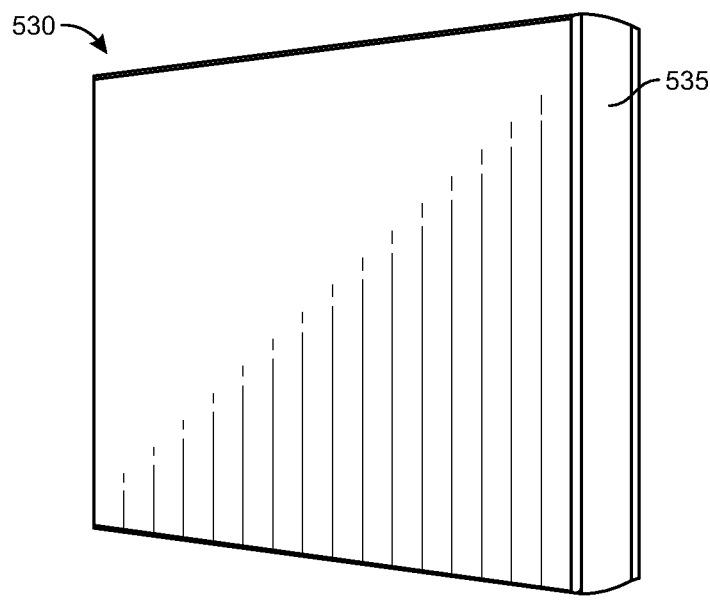
FIG. 5 is a perspective illustration of an example two-dimensional optical connector according to some embodiments.

Referring to FIG. 5, shown is an optical connector according to some embodiments. As in the illustrated embodiment, optical connector 530 may include a substantially planar structure. Optical connector 530, e.g., planar waveguide, may include an optically-transparent material such as silicon dioxide, silicon nitride, silicon oxynitride, or titanium dioxide, for example. Sidewalls 535 of the optical connector 530 may be polished and/or coated, e.g., with a metallization layer (not shown), to increase the refractive index contrast between the optical connector and the surrounding environment. Optical connector 530 (such as optical connector 130) may be located between the output of a light source (e.g., light emitter 110) and the input of a photovoltaic cell array (e.g., photovoltaic cell array 120) and may be configured to efficiently transmit light from the light source to the photovoltaic cell array.

Figure 6:
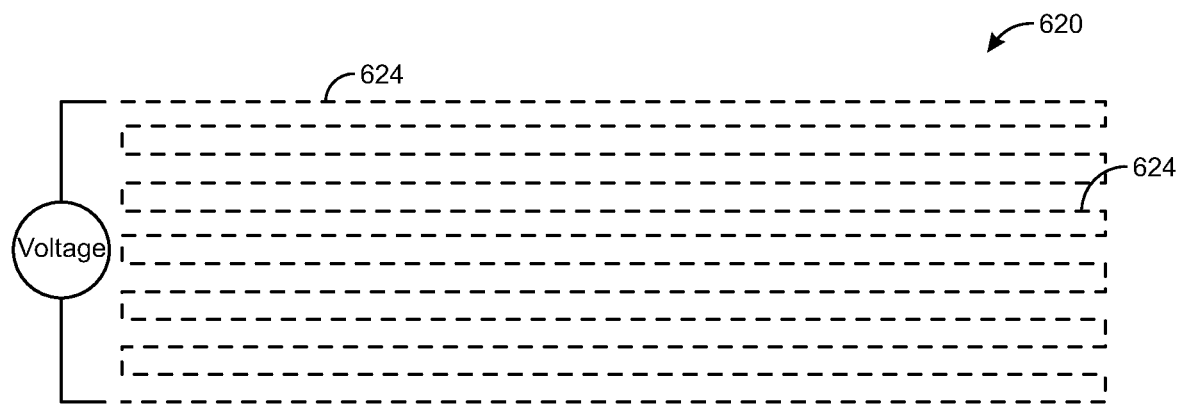
FIG. 6 is a diagram showing an array of photovoltaic cells arranged in series according to some embodiments.

As noted above with reference to FIG. 1, a photovoltaic cell array may include multiple photovoltaic elements that are electrically connected in series. Referring to FIG. 6, illustrated schematically is an example photovoltaic cell array 620 having plural such photovoltaic elements 624. In the illustrated embodiment, photovoltaic cell array 620 may include plural rows of interconnected photovoltaic elements 624.

Figure 7:
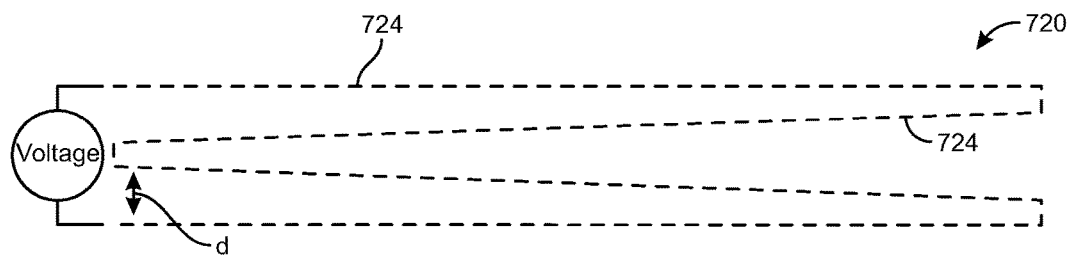
FIG. 7 is a diagram showing an array of photovoltaic cells arranged in series and having a tapered profile according to some embodiments.

Referring to FIG. 7, illustrated is a further example photovoltaic cell array 720. Photovoltaic cell array 720 may include plural photovoltaic elements 724 arranged in non-parallel rows, i.e., rows having a tapered configuration, where a distance (d) between corresponding elements in adjacent rows may be variable. For instance, the intercell distance (d) may increase (or decrease) monotonically along or across a row. According to some embodiments, such a tapered configuration may be used to inhibit leakage or electric breakdown by defining the intercell distance (d) as a function of the intercell voltage. That is, the distance between cells having a greater intercell potential may be increased relative to the distance between cells having a lesser intercell potential, which may improve device lifetime and/or performance.

Figure 8:
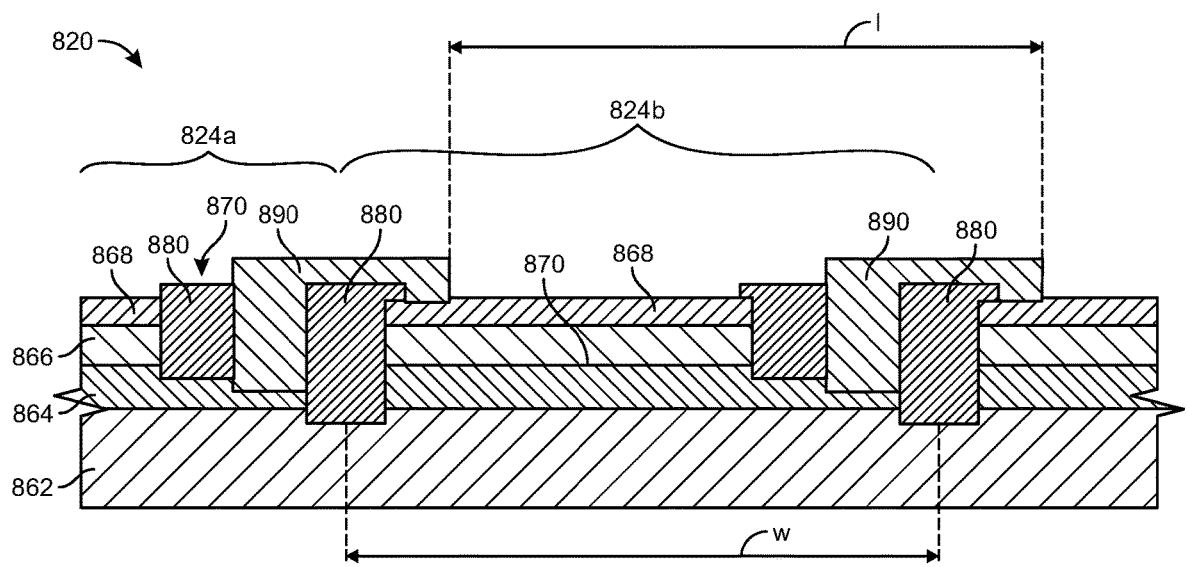
FIG. 8 is a cross-sectional schematic view of a photovoltaic cell architecture showing the connection between neighboring cells according to some embodiments.

Referring to FIG. 8, shown is a cross-sectional schematic diagram of a photovoltaic cell array highlighting the region between neighboring cells. The illustrated photovoltaic cell array 820 includes a first photovoltaic cell 824a and an adjacent second photovoltaic cell 824b. The structure includes, from bottom to top, a semiconductor substrate 862, an n-type semiconductor layer 864, a p-type semiconductor layer 866, and a highly-doped p-type semiconductor contact layer 868. A p-n junction 870 may be formed at the interface between the n-type semiconductor layer 864 and the p-type semiconductor layer 866.

The semiconductor substrate 862 may include GaAs, for example, and the overlying semiconductor layers 864, 866, and 868 may include suitably doped homoepitaxial layers, i.e., doped GaAs. In accordance with some embodiments, Applicants have shown that GaAs-based photovoltaic cells may have an open circuit voltage of approximately 1V, whereas larger open circuit voltages may be achieved by using wider bandgap material systems, such as AlGaAs or GaN. According to further embodiments, the photovoltaic cells may include an indirect bandgap semiconductor such as silicon.

Each individual photovoltaic cell 824a, 824b may be formed using conventional photolithography techniques by etching a via 870 through the contact layer 868 and the p-type semiconductor layer 866 to expose a top surface of the n-type semiconductor layer 864 within one region of the via 870 and a top surface of the substrate 862 within a second region of the via 870. A passivation layer 880 may be formed within the first and second regions of the via 870, i.e., directly overlying the n-type semiconductor layer 864 and the substrate 862, respectively. As will be appreciated, the passivation layer 880 may enable an intercell connection in series without undo parallel leakage current.

A metallization (conductive) layer 890 may be deposited over substrate 862, including within via 870. In particular embodiments, metallization layer 890 may be formed directly over the n-type semiconductor layer 864 of first photovoltaic cell 824a and extend over a portion of the passivation layer 880 to contact an upper surface of the contact layer 868 of second photovoltaic cell 824b. Metallization layer 890 may form an ohmic contact with an upper surface of the highly-doped p-type contact layer 868.

Photovoltaic cells 824a, 824b, etc. may have an individual cell size (e.g., length and/or width) (w) and may be arrayed at a constant or variable pitch (I). The cell size (w) and the pitch (I) may independently range from approximately 10 micrometers to approximately 250 micrometers, e.g., 10, 15, 20, 25, 30, 35, 40, 45, 50, 100, 150, 200, or 250 micrometers, including ranges between any of the foregoing values.

Figure 9:
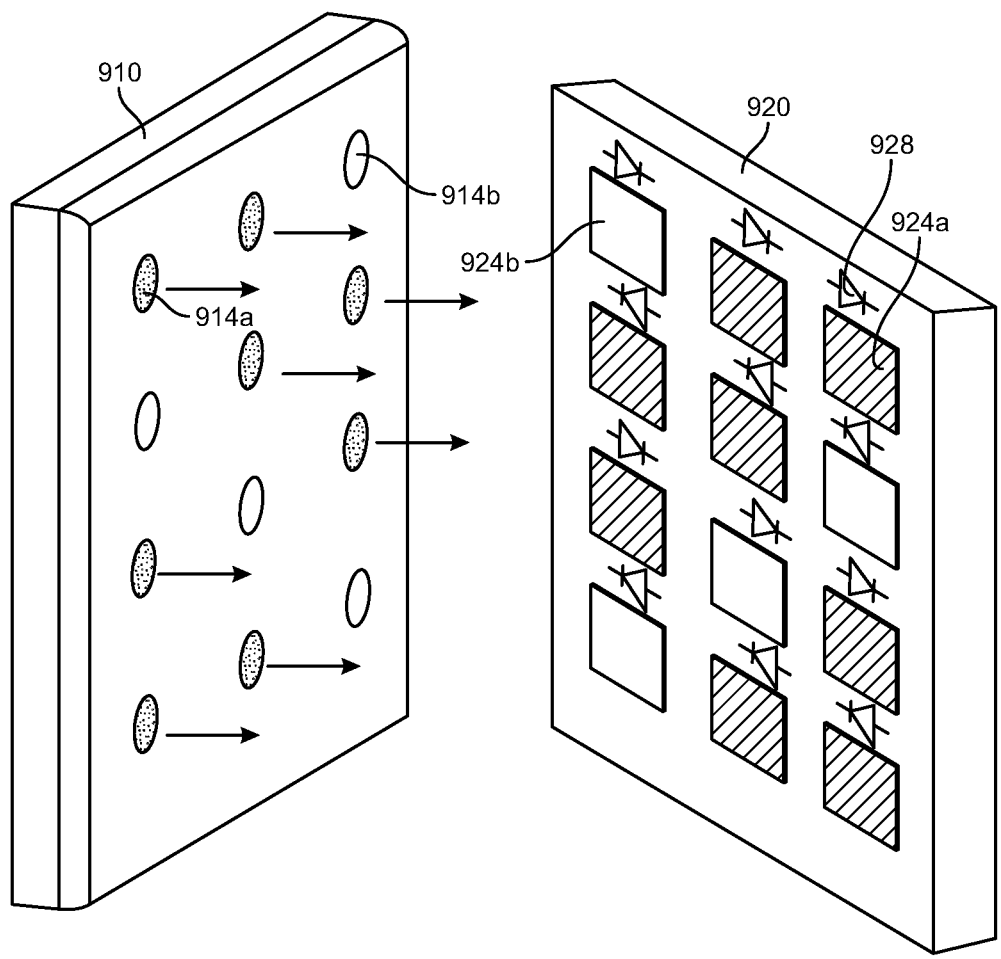
FIG. 9 illustrates an addressable emitter array and the selective illumination of a photovoltaic cell array according to various embodiments.

According to some embodiments, individual emitters within an emitter array may be independently addressable and configured to illuminate a subset of the photovoltaic elements within a photovoltaic cell array. Referring to FIG. 9, for example, light emitter 910 may include a plurality of individual emitters that can be switched on (e.g., emitter 914a) or off (e.g., emitter 914b) to selectively illuminate photovoltaic cells 924a, 924b, respectively, within photovoltaic cell array 920. Light emitter 910 may include an addressable array of VCSELs or LEDs, for example. The individual emitters, e.g., emitter 914a and emitter 914b, may be configured to emit light simultaneously, sequentially, or in combinations thereof. Moreover, one or a plurality of different voltage and/or current levels may be set to control the intensity of the high voltage output. According to some embodiments, multiple contact taps may be used to select different voltage output levels.

According to certain embodiments, photovoltaic cell array 920 may further include bypass diodes 928, which may be connected in parallel to individual cells or groups of cells to enable current flow around damaged cells or non-illuminated cells (e.g., photovoltaic cell 924b). Furthermore, a light emitter and/or photovoltaic cell array may include redundant features or elements configured to accommodate failure of one or more components. A smart drive scheme, for instance, may re-route power around damaged pixels or cells.

Figure 10:
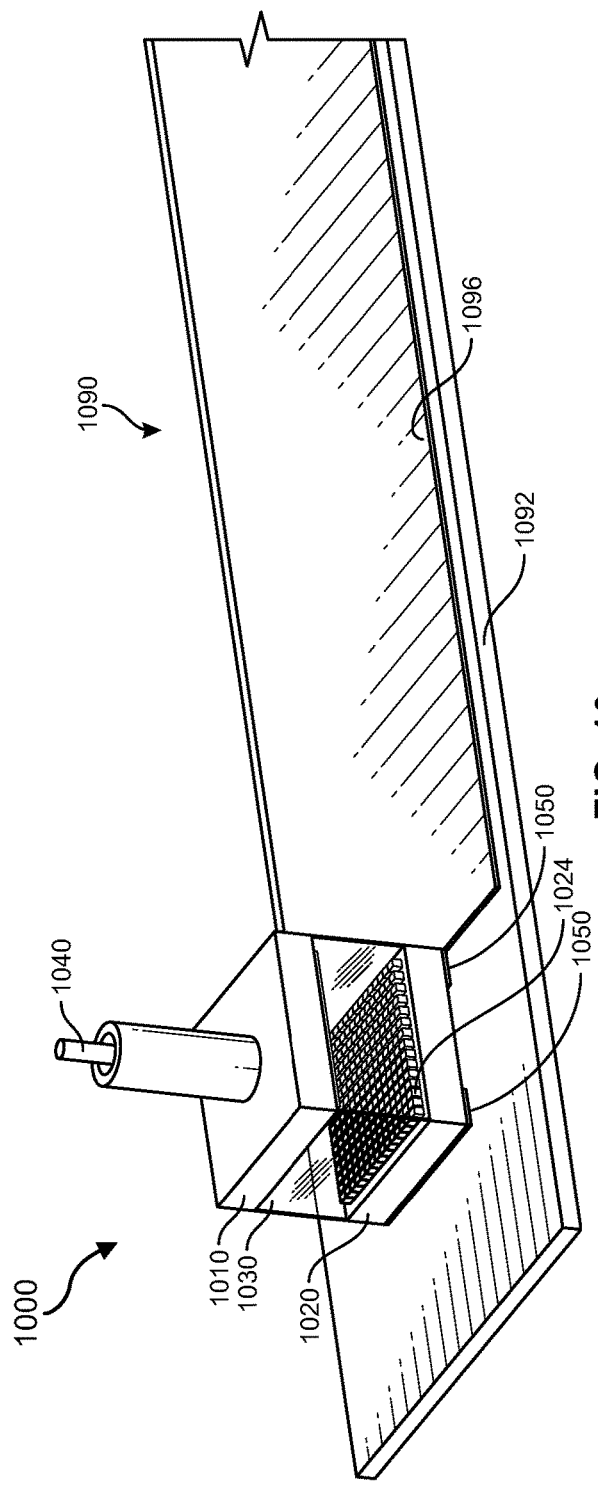
FIG. 10 shows an example actuator integrated with an optical transformer in accordance with certain embodiments.

The optical transformers disclosed herein may be incorporated into a variety of devices and systems. An example device may include an actuator, such as a piezoelectric actuator or an electroactive actuator. Turning to FIG. 10, for example, shown is an optical transformer integrated with a bender beam actuator. Optical transformer 1000 may include a light emitter 1010, a photovoltaic cell array 1020 facing the light emitter 1010, and an optical connector 1030 disposed between the light emitter 1010 and the photovoltaic cell array 1020.

Light emitter 1010 may include an array of individual emitters (not shown) and may be powered with a voltage source 1040. As disclosed herein, light emitter 1010 may include a laser or a light-emitting diode. Photovoltaic cell array 1020 may include a plurality of photovoltaic cells 1024. At least a portion of the photovoltaic cells 1024 may be electrically connected in series. Optical transformer 1000 may further include a high voltage output 1050.

Optical transformer 1000 may be mounted directly on actuator 1090, which may include an electroactive layer 1092 disposed between a primary (overlying) electrode 1096 and a secondary (underlying) electrode (not shown). In certain embodiments, optical transformer 1000 may be mounted directly on the electroactive layer 1092, which may advantageously obviate the need for high voltage wiring and enable the realization of a compact architecture. The electroactive layer 1092 may include a ceramic or other dielectric material, for example, and the electrodes may each include one or more layers of any suitable conductive material(s), such as transparent conductive oxides (e.g., TCOs such as ITO), graphene, etc. High voltage output 1050 may be connected to primary electrode 1096, for example.

Thus, according to some embodiments, an actuation system may include (i) an optical transformer having a light source and a serial array of photovoltaic cells optically coupled to the light source, and (ii) an actuator having a primary electrode, a secondary electrode overlapping at least a portion of the primary electrode, and an electroactive layer disposed between and abutting the primary electrode and the secondary electrode, where the primary electrode is electrically connected to an output of the optical transformer.

According to certain embodiments, actuator 1090 may include a unimorph or a bimorph construction. A "unimorph" construction may, in some examples, refer to a device having a single electroactive layer sandwiched between paired electrodes. A "bimorph" construction may, in some examples, refer to a device including two electroactive layers each sandwiched between opposing electrodes. According to certain embodiments, actuator 1090 may have a length and a width that independently vary from approximately 5 mm to approximately 50 mm, e.g., 5, 10, 15, 20, 25, 30, 35, 40, 45, or 50 mm, including ranges between any of the foregoing values.

As used herein, "electroactive layer" or "electroactive ceramic" may, in some examples, refer to materials that exhibit a change in size or shape when stimulated by an electric field. In the presence of an electrostatic field (E-field), an electroactive material may deform (e.g., compress, elongate, bend, etc.) according to the magnitude and direction of the applied field. Generation of such a field may be accomplished by placing the electroactive material between two electrodes, i.e., a primary electrode and a secondary electrode, each of which is at a different potential. As the potential difference (i.e., voltage difference) between the electrodes is increased (e.g., from zero potential) the amount of deformation may also increase, principally along electric field lines. This deformation may achieve saturation when a certain electrostatic field strength has been reached. With no electrostatic field, the electroactive material may be in its relaxed state undergoing no induced deformation, or stated equivalently, no induced strain, either internal or external.

Example electroactive ceramics may include one or more electroactive, piezoelectric, antiferroelectric, relaxor, or ferroelectric ceramics, such as perovskite ceramics, including lead titanate, lead zirconate, lead zirconate titanate (PZT), lead magnesium niobate, lead zinc niobate, lead indium niobate, lead magnesium tantalate, lead magnesium niobate-lead titanate (PMT-PT), lead zinc niobate-lead titanate (PZN-PT), lead indium tantalate, barium titanate, lithium niobate, potassium niobate, sodium potassium niobate, bismuth sodium titanate, and bismuth ferrite, as well as solid solutions or mixtures thereof. Example non-perovskite piezoelectric ceramics include quartz and gallium nitride. According to some embodiments, an electroactive ceramic may be doped with one or more dopants selected from calcium, lanthanum, europium, neodymium, scandium, and erbium. According to some embodiments, an electroactive material may include a dielectric material. Example dielectric compositions may have a composite (i.e., multi-phase) architecture that may include a liquid or gaseous material dispersed throughout a solid matrix.

In certain embodiments, the electroactive ceramics disclosed herein may be perovskite ceramics and may be substantially free of secondary phases, i.e., may contain less than approximately 2% by volume of any secondary phase, including porosity, e.g., less than 2%, less than 1%, less than 0.5%, less than 0.2%, or less than 0.1%, including ranges between any of the foregoing values. Further example secondary phases may include pyrochlores, which may adversely impact the material's piezoelectric response. In certain embodiments, the disclosed electroactive ceramics may be birefringent, which may be attributable to the material including plural distinct domains or regions of varying polarization having different refractive indices, such that the refractive index experienced by light passing through the material may be a function of the propagation direction of the light as well as its polarization.

Ceramic electroactive materials, such as single crystal piezoelectric materials, may be formed, for example, using hydrothermal processing or by a Czochralski method to produce an oriented ingot, which may be cut along a specified crystal plane to produce wafers having a desired crystalline orientation. Further methods for forming single crystals include float zone, Bridgman, Stockbarger, chemical vapor deposition, physical vapor transport, solvothermal techniques, etc. A wafer may be thinned, e.g., via lapping or grinding, and/or polished, and transparent electrodes may be formed directly on the wafer, e.g., using chemical vapor deposition or a physical vapor deposition process such as sputtering or evaporation.

In addition to the foregoing, polycrystalline piezoelectric materials may be formed, e.g., by powder processing. Densely-packed networks of high purity, ultrafine polycrystalline particles can be highly transparent and may be more mechanically robust in thin layers than their single crystal counterparts. For instance, optical grade lanthanum-doped lead zirconate titanate (PLZT) having >99.9% purity may be formed using sub-micron (e.g., <2 µm) particles. In this regard, substitution via doping of $Pb^{2+}$ at A and B-site vacancies with $La^{2+}$ and/or $Ba^{2+}$ may be used to increase the transparency of perovskite ceramics such as PZN-PT, PZT and PMN-PT.

According to some embodiments, ultrafine particle precursors can be fabricated via wet chemical methods, such as chemical co-precipitation, sol-gel and gel combustion. Green bodies may be formed using tape casting, slip casting, or gel casting. High pressure and high temperature sintering using techniques such as hot pressing, high pressure (HP) and hot isostatic pressure, spark plasma sintering, and microwave sintering, for example, may be used to improve the ceramic particle packing density. Thinning via lapping, grinding and/or polishing may be used to decrease surface roughness to achieve thin, highly optically transparent layers that are suitable for high displacement actuation. As measured by atomic force microscopy (AFM) or interferometry, an electroactive ceramic may have an RMS surface roughness of less than approximately 5 nm, e.g., approximately 1, 2, or 5 nm, including ranges between any of the foregoing values.

The electroactive ceramic may be poled to achieve a desired dipole alignment. As used herein, "poling" to form a "poled" material may, in some examples, refer to a process whereby an electric field is applied to an electroactive ceramic. The effect of poling may include an alignment of the various domains within the material to produce a net polarization in the direction of the applied field.

Ceramics having a preferred crystallographic orientation (i.e., texture) may be formed by various methods, including electrophoresis, slip casting, electric field alignment, magnetic field alignment, high pressure sintering, uniaxial pressing, temperature gradients, spark plasma sintering, directional solidification, templated grain growth, rolling, and shear alignment.

In some embodiments, an actuator may include paired electrodes, which allow the creation of the electrostatic field that forces constriction of the electroactive layer. In some embodiments, an "electrode," as used herein, may refer to an electrically conductive material, which may be in the form of a thin film or a layer. Electrodes may include relatively thin, electrically conductive metals or metal alloys and may be of a non-compliant or compliant nature.

An electrode may include one or more electrically conductive materials, such as a metal, a semiconductor (e.g., a doped semiconductor), carbon nanotubes, graphene, oxidized graphene, fluorinated graphene, hydrogenated graphene, other graphene derivatives, carbon black, transparent conductive oxides (TCOs, e.g., indium tin oxide (ITO), zinc oxide (ZnO), etc.), or other electrically conducting materials. In some embodiments, the electrodes may include a metal such as aluminum, gold, silver, platinum, palladium, nickel, tantalum, tin, copper, indium, gallium, zinc, alloys thereof, and the like. Further example transparent conductive oxides include, without limitation, aluminum-doped zinc oxide, fluorine-doped tin oxide, indium-doped cadmium oxide, indium zinc oxide, indium gallium tin oxide, indium gallium zinc tin oxide, strontium vanadate, strontium niobate, strontium molybdate, calcium molybdate, and indium zinc tin oxide.

In some embodiments, the electrode or electrode layer may be self-healing, such that damage from local shorting of a circuit can be isolated. Suitable self-healing electrodes may include thin films of materials which deform or oxidize irreversibly upon Joule heating, such as, for example, aluminum.

In some embodiments, a primary electrode may overlap (e.g., overlap in a parallel direction) at least a portion of a secondary electrode. The primary and secondary electrodes may be generally parallel and spaced apart and separated by a layer of electroactive material.

In some embodiments, the electrodes described herein (e.g., the primary electrode, the secondary electrode, or any other electrode including any common electrode) may be fabricated using any suitable process. For example, the electrodes may be fabricated using physical vapor deposition (PVD), chemical vapor deposition (CVD), atomic layer deposition (ALD), evaporation, spray-coating, spin-coating, dip-coating, screen printing, Gravure printing, ink jet printing, aerosol jet printing, doctor blading, and the like. In further aspects, the electrodes may be manufactured using a thermal evaporator, a sputtering system, stamping, and the like.

In some embodiments, a layer of electroactive material may be deposited directly on to an electrode. In some embodiments, an electrode layer may be deposited directly on to the electroactive material. In some embodiments, electrodes may be prefabricated and attached to an electroactive material. In some embodiments, an electrode may be deposited on a substrate, for example a glass substrate or flexible polymer film. In some embodiments, the electroactive material layer may directly abut an electrode. In some embodiments, there may be an insulating layer, such as a dielectric layer, between a layer of electroactive material and an electrode.

The electrodes may be used to affect large scale deformation, i.e., via full-area coverage, or the electrodes may be patterned to provide spatially localized stress/strain profiles. In particular embodiments, a deformable optical element and an electroactive layer may be co-integrated whereby the deformable optic may itself be actuatable. In addition, various methods of forming optical elements are disclosed, including solution-based and solid-state deposition techniques.

Figure 11:
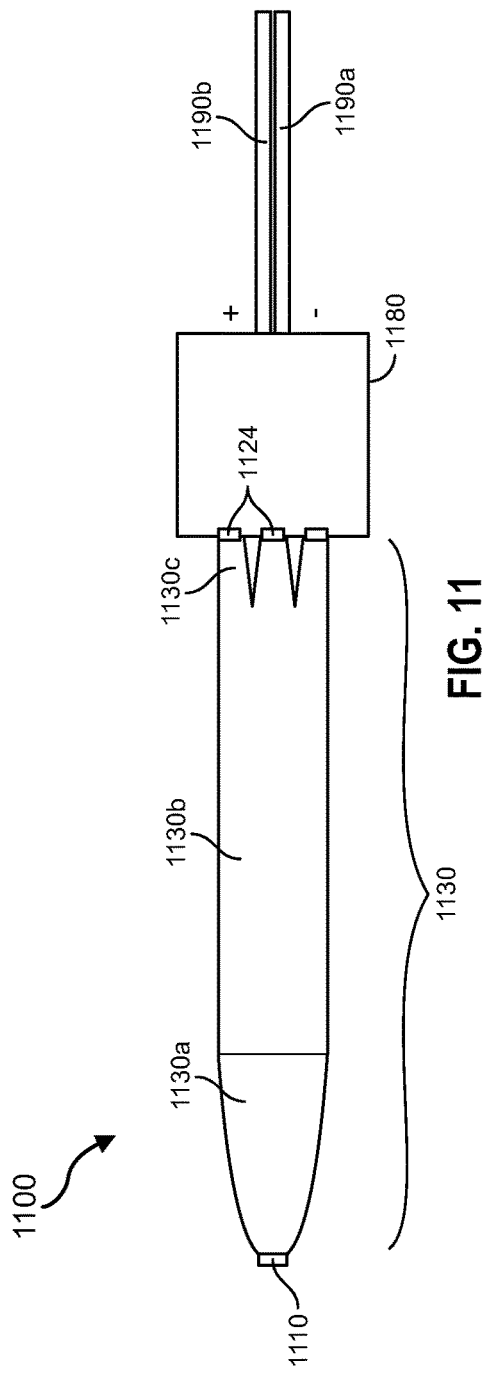
FIG. 11 depicts an actuator system coupled with a source of electromagnetic radiation according to some embodiments.

A further example high voltage system is shown schematically in FIG. 11, which includes an optical transformer integrated with a bimorph actuator. Optical transformer 1100 may include a light source 1110 optically coupled to a plurality of photovoltaic elements 1124 via optical connector 1130. Optical connector 1130 may be an optical fiber and may include a tapered input 1130a, fiberoptic main body 1130b, and output guides 1130c. Output guides 1130c may be configured to efficiently direct light from the fiber main body 1130b to the individual photovoltaic elements 1124.

Circuit 1180 may be configured to convey the electrical (high voltage) output from photovoltaic elements 1124 to actuators 1190a, 1190b. According to some embodiments, each actuator 1190a, 1190b may include a pair of electrodes and an electroactive layer disposed between the electrodes. According to some embodiments, the bimorph actuators 1190a, 1190b may include a shared electrode between the electroactive layers.

As disclosed herein, an optical transformer having a commercially-relevant form factor may be configured to convert a low (~1-2V) DC input voltage to a high (>1 kV) DC output voltage. The optical transformer may include a light source optically coupled to an array of photovoltaic cells. The light source may be a surface-emitting device or an edge-emitting device and may include a laser or a light emitting diode, for example. The photovoltaic cells, which are at least partially connected in series, may include a direct band gap semiconductor such as GaAs or InGaAs. Photons produced by the DC-powered light source may be directed via an optical connector, e.g., waveguide or fiber optic element, to the photovoltaic cells to produce electrical carriers that generate a high electrical voltage across the array.

In certain embodiments, areal dimensions of the individual photovoltaic cells may range from approximately 1 µm×1 µm to approximately 250 µm×250 µm. In certain embodiments, the photovoltaic cells may be illuminated selectively to control the output voltage. That is, the light source may include an addressable array of emitters that can be switched on or off to illuminate a given number of photovoltaic cells.

Voltage or current modulation may be used to control the optical power generated by the light source and accordingly adjust the output voltage. According to some embodiments, the optical transformer may be integrated into a variety of high voltage systems or devices, including a piezoelectric or electrostatic actuator.

EXAMPLE EMBODIMENTS

Example 1: An optical transformer includes a light source and an array of photovoltaic cells optically coupled to the light source, where at least a portion of the photovoltaic cells are connected in series.

Example 2: The optical transformer of Example 1, where the light source includes a surface-emitting device or an edge-emitting device.

Example 3: The optical transformer of any of Examples 1 and 2, where the light source includes a laser or a light-emitting diode.

Example 4: The optical transformer of any of Examples 1-3, where the light source includes a plurality of independently-controlled emitters.

Example 5: The optical transformer of any of Examples 1-4, where the light source further includes an optical element adapted to focus light generated by the light source.

Example 6: The optical transformer of any of Examples 1-5, where an emission spectrum of the light source at least partially overlaps an absorption profile of the array of photovoltaic cells.

Example 7: The optical transformer of any of Examples 1-6, further including a cooling element configured to control a temperature of the light source.

Example 8: The optical transformer of any of Examples 1-7, where the photovoltaic cells include a direct bandgap compound semiconductor.

Example 9: The optical transformer of any of Examples 1-8, where the photovoltaic cells include at least one structure selected from a p-n junction, a Schottky diode, a quantum well, and a quantum dot.

Example 10: The optical transformer of any of Examples 1-9, where at least a portion of the photovoltaic cells are connected in parallel.

Example 11: The optical transformer of any of Examples 1-10, where the array of photovoltaic cells includes one or more bypass diodes.

Example 12: The optical transformer of any of Examples 1-11, where the photovoltaic cells are disposed within multiple sub-arrays each having a voltage output port.

Example 13: The optical transformer of any of Examples 1-12, further including an optical connector disposed between an output of the light source and an input of the array of photovoltaic cells.

Example 14: The optical transformer of any of Examples 1-13, where a volume of the optical transformer is less than approximately 5 mm$^3$.

Example 15: An actuation system includes (i) an optical transformer having a light source and a serial array of photovoltaic cells optically coupled to the light source, and (ii) an actuator having (a) a primary electrode, (b) a secondary electrode overlapping at least a portion of the primary electrode, and (c) an electroactive layer disposed between and abutting the primary electrode and the secondary electrode, where the primary electrode is electrically connected to an output of the optical transformer.

Example 16: The actuation system of Example 15, where the optical transformer is mounted on the actuator.

Example 17: A method includes applying an input voltage to a light source to form rays of electromagnetic radiation and illuminating the electromagnetic radiation onto a serial array of photovoltaic cells.

Example 18: The method of Example 17, where the light source includes an array of emitters and the input voltage is applied to a subset of the emitters.

Example 19: The method of any of Examples 17 and 18, where illuminating the array of photovoltaic cells includes directing the electromagnetic radiation through an optical connector disposed between an output of the light source and an input of the array of photovoltaic cells.

Example 20: The method of any of Examples 17-19, where the light source is controlled by current modulation or voltage modulation.

Embodiments of the present disclosure may include or be implemented in conjunction with various types of artificial-reality systems. Artificial reality is a form of reality that has been adjusted in some manner before presentation to a user, which may include, e.g., a virtual reality, an augmented reality, a mixed reality, a hybrid reality, or some combination and/or derivative thereof. Artificial-reality content may include completely generated content or generated content combined with captured (e.g., real-world) content. The artificial-reality content may include video, audio, haptic feedback, or some combination thereof, any of which may be presented in a single channel or in multiple channels (such as stereo video that produces a three-dimensional (3D) effect to the viewer). Additionally, in some embodiments, artificial reality may also be associated with applications, products, accessories, services, or some combination thereof, that are used to, e.g., create content in an artificial reality and/or are otherwise used in (e.g., to perform activities in) an artificial reality.

Artificial-reality systems may be implemented in a variety of different form factors and configurations. Some artificial-reality systems may be designed to work without near-eye displays (NEDs), an example of which is augmented-reality system 1200 in FIG. 12. Other artificial-reality systems may include an NED that also provides visibility into the real world (e.g., augmented-reality system 1300 in FIG. 13) or that visually immerses a user in an artificial reality (e.g., virtual-reality system 1400 in FIG. 14). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 12:
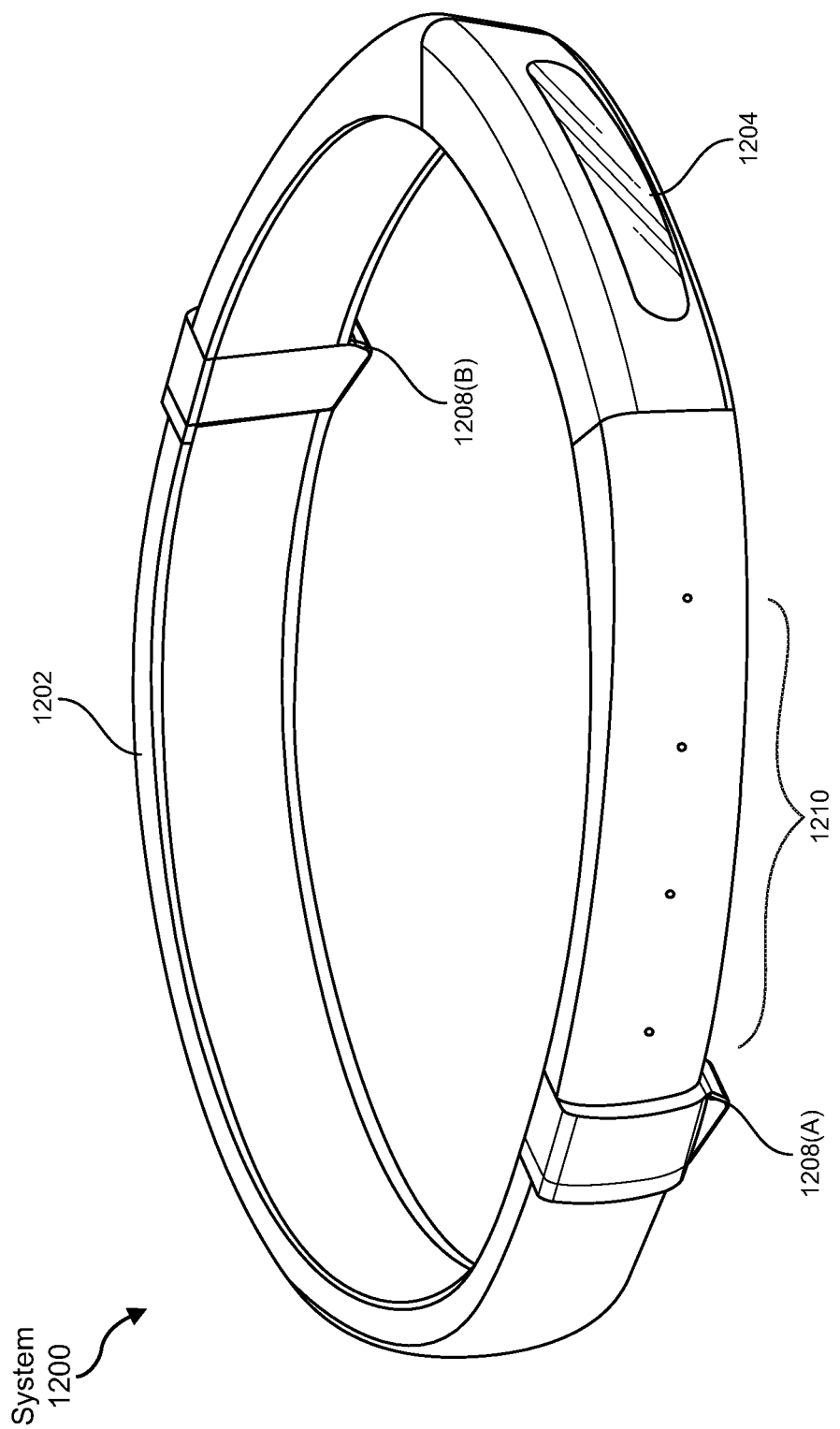
FIG. 12 is an illustration of an exemplary artificial-reality headband that may be used in connection with embodiments of this disclosure.

Turning to FIG. 12, augmented-reality system 1200 generally represents a wearable device dimensioned to fit about a body part (e.g., a head) of a user. As shown in FIG. 12, system 1200 may include a frame 1202 and a camera assembly 1204 that is coupled to frame 1202 and configured to gather information about a local environment by observing the local environment. Augmented-reality system 1200 may also include one or more audio devices, such as output audio transducers 1208(A) and 1208(B) and input audio transducers 1210. Output audio transducers 1208(A) and 1208(B) may provide audio feedback and/or content to a user, and input audio transducers 1210 may capture audio in a user's environment.

As shown, augmented-reality system 1200 may not necessarily include an NED positioned in front of a user's eyes. Augmented-reality systems without NEDs may take a variety of forms, such as head bands, hats, hair bands, belts, watches, wrist bands, ankle bands, rings, neckbands, necklaces, chest bands, eyewear frames, and/or any other suitable type or form of apparatus. While augmented-reality system 1200 may not include an NED, augmented-reality system 1200 may include other types of screens or visual feedback devices (e.g., a display screen integrated into a side of frame 1202).

Figure 13:
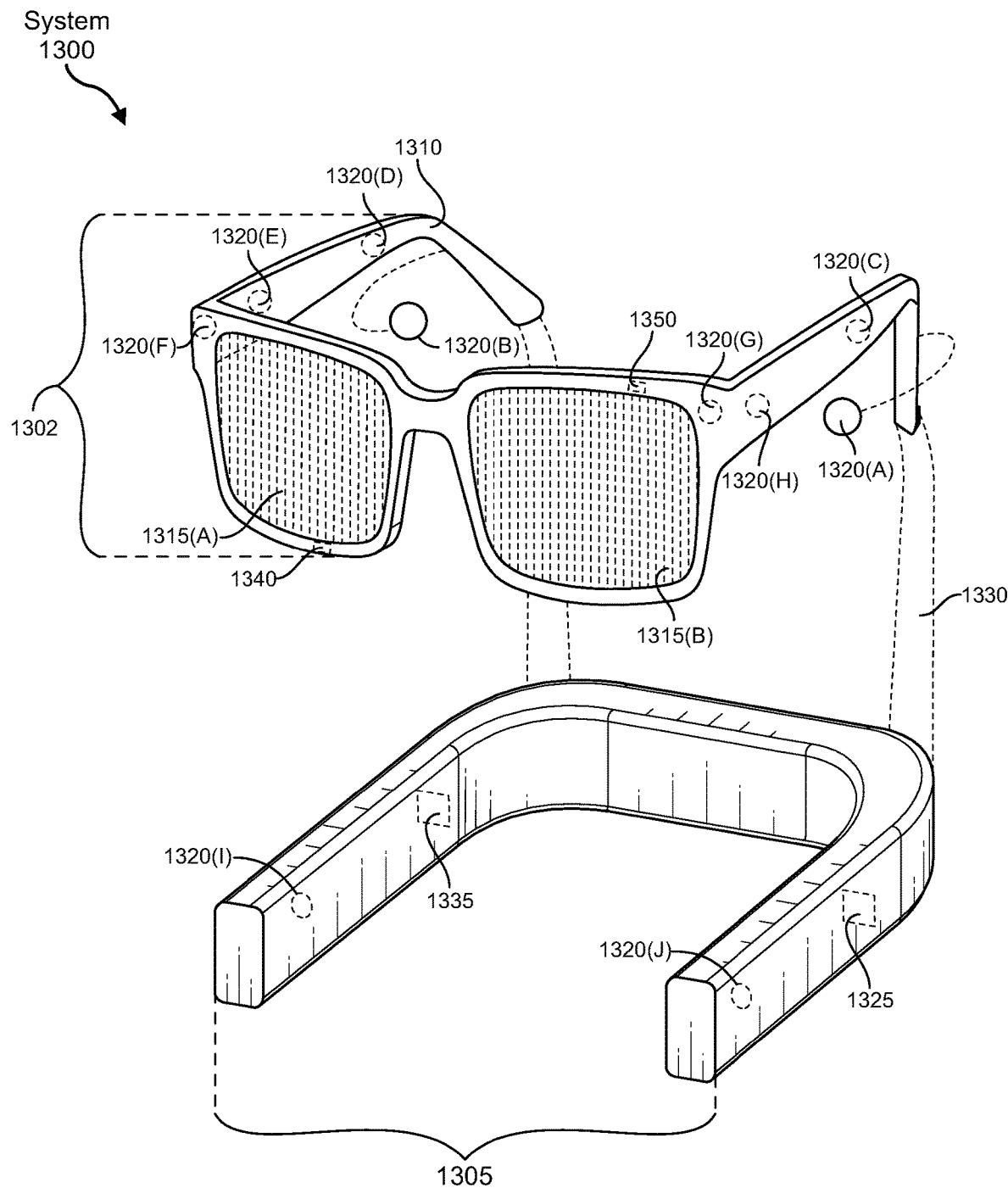
FIG. 13 is an illustration of exemplary augmented-reality glasses that may be used in connection with embodiments of this disclosure.

The embodiments discussed in this disclosure may also be implemented in augmented-reality systems that include one or more NEDs. For example, as shown in FIG. 13, augmented-reality system 1300 may include an eyewear device 1302 with a frame 1310 configured to hold a left display device 1315(A) and a right display device 1315(B) in front of a user's eyes. Display devices 1315(A) and 1315(B) may act together or independently to present an image or series of images to a user. While augmented-reality system 1300 includes two displays, embodiments of this disclosure may be implemented in augmented-reality systems with a single NED or more than two NEDs.

In some embodiments, augmented-reality system 1300 may include one or more sensors, such as sensor 1340. Sensor 1340 may generate measurement signals in response to motion of augmented-reality system 1300 and may be located on substantially any portion of frame 1310. Sensor 1340 may represent a position sensor, an inertial measurement unit (IMU), a depth camera assembly, or any combination thereof. In some embodiments, augmented-reality system 1300 may or may not include sensor 1340 or may include more than one sensor. In embodiments in which sensor 1340 includes an IMU, the IMU may generate calibration data based on measurement signals from sensor 1340. Examples of sensor 1340 may include, without limitation, accelerometers, gyroscopes, magnetometers, other suitable types of sensors that detect motion, sensors used for error correction of the IMU, or some combination thereof.

Augmented-reality system 1300 may also include a microphone array with a plurality of acoustic transducers 1320(A)-1320(J), referred to collectively as acoustic transducers 1320. Acoustic transducers 1320 may be transducers that detect air pressure variations induced by sound waves. Each acoustic transducer 1320 may be configured to detect sound and convert the detected sound into an electronic format (e.g., an analog or digital format). The microphone array in FIG. 2 may include, for example, ten acoustic transducers: 1320(A) and 1320(B), which may be designed to be placed inside a corresponding ear of the user, acoustic transducers 1320(C), 1320(D), 1320(E), 1320(F), 1320(G), and 1320(H), which may be positioned at various locations on frame 1310, and/or acoustic transducers 1320(I) and 1320(J), which may be positioned on a corresponding neckband 1305.

In some embodiments, one or more of acoustic transducers 1320(A)-(F) may be used as output transducers (e.g., speakers). For example, acoustic transducers 1320(A) and/or 1320(B) may be earbuds or any other suitable type of headphone or speaker.

The configuration of acoustic transducers 1320 of the microphone array may vary. While augmented-reality system 1300 is shown in FIG. 13 as having ten acoustic transducers 1320, the number of acoustic transducers 1320 may be greater or less than ten. In some embodiments, using higher numbers of acoustic transducers 1320 may increase the amount of audio information collected and/or the sensitivity and accuracy of the audio information. In contrast, using a lower number of acoustic transducers 1320 may decrease the computing power required by an associated controller 1350 to process the collected audio information. In addition, the position of each acoustic transducer 1320 of the microphone array may vary. For example, the position of an acoustic transducer 1320 may include a defined position on the user, a defined coordinate on frame 1310, an orientation associated with each acoustic transducer 1320, or some combination thereof.

Acoustic transducers 1320(A) and 1320(B) may be positioned on different parts of the user's ear, such as behind the pinna or within the auricle or fossa. Or, there may be additional acoustic transducers 1320 on or surrounding the ear in addition to acoustic transducers 1320 inside the ear canal. Having an acoustic transducer 1320 positioned next to an ear canal of a user may enable the microphone array to collect information on how sounds arrive at the ear canal. By positioning at least two of acoustic transducers 1320 on either side of a user's head (e.g., as binaural microphones), augmented-reality device 1300 may simulate binaural hearing and capture a 3D stereo sound field around about a user's head. In some embodiments, acoustic transducers 1320(A) and 1320(B) may be connected to augmented-reality system 1300 via a wired connection 1330, and in other embodiments, acoustic transducers 1320(A) and 1320(B) may be connected to augmented-reality system 1300 via a wireless connection (e.g., a Bluetooth connection). In still other embodiments, acoustic transducers 1320(A) and 1320(B) may not be used at all in conjunction with augmented-reality system 1300.

Acoustic transducers 1320 on frame 1310 may be positioned along the length of the temples, across the bridge, above or below display devices 1315(A) and 1315(B), or some combination thereof. Acoustic transducers 1320 may be oriented such that the microphone array is able to detect sounds in a wide range of directions surrounding the user wearing the augmented-reality system 1300. In some embodiments, an optimization process may be performed during manufacturing of augmented-reality system 1300 to determine relative positioning of each acoustic transducer 1320 in the microphone array.

In some examples, augmented-reality system 1300 may include or be connected to an external device (e.g., a paired device), such as neckband 1305. Neckband 1305 generally represents any type or form of paired device. Thus, the following discussion of neckband 1305 may also apply to various other paired devices, such as charging cases, smart watches, smart phones, wrist bands, other wearable devices, hand-held controllers, tablet computers, laptop computers and other external compute devices, etc.

As shown, neckband 1305 may be coupled to eyewear device 1302 via one or more connectors. The connectors may be wired or wireless and may include electrical and/or non-electrical (e.g., structural) components. In some cases, eyewear device 1302 and neckband 1305 may operate independently without any wired or wireless connection between them. While FIG. 13 illustrates the components of eyewear device 1302 and neckband 1305 in example locations on eyewear device 1302 and neckband 1305, the components may be located elsewhere and/or distributed differently on eyewear device 1302 and/or neckband 1305. In some embodiments, the components of eyewear device 1302 and neckband 1305 may be located on one or more additional peripheral devices paired with eyewear device 1302, neckband 1305, or some combination thereof.

Pairing external devices, such as neckband 1305, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 1300 may be provided by a paired device or shared between a paired device and an eyewear device, thus reducing the weight, heat profile, and form factor of the eyewear device overall while still retaining desired functionality. For example, neckband 1305 may allow components that would otherwise be included on an eyewear device to be included in neckband 1305 since users may tolerate a heavier weight load on their shoulders than they would tolerate on their heads. Neckband 1305 may also have a larger surface area over which to diffuse and disperse heat to the ambient environment. Thus, neckband 1305 may allow for greater battery and computation capacity than might otherwise have been possible on a stand-alone eyewear device. Since weight carried in neckband 1305 may be less invasive to a user than weight carried in eyewear device 1302, a user may tolerate wearing a lighter eyewear device and carrying or wearing the paired device for greater lengths of time than a user would tolerate wearing a heavy stand-alone eyewear device, thereby enabling users to more fully incorporate artificial-reality environments into their day-to-day activities.

Neckband 1305 may be communicatively coupled with eyewear device 1302 and/or to other devices. These other devices may provide certain functions (e.g., tracking, localizing, depth mapping, processing, storage, etc.) to augmented-reality system 1300. In the embodiment of FIG. 13, neckband 1305 may include two acoustic transducers (e.g., 1320(I) and 1320(J)) that are part of the microphone array (or potentially form their own microphone subarray). Neckband 1305 may also include a controller 1325 and a power source 1335.

Acoustic transducers 1320(I) and 1320(J) of neckband 1305 may be configured to detect sound and convert the detected sound into an electronic format (analog or digital). In the embodiment of FIG. 13, acoustic transducers 1320(I) and 1320(J) may be positioned on neckband 1305, thereby increasing the distance between the neckband acoustic transducers 1320(I) and 1320(J) and other acoustic transducers 1320 positioned on eyewear device 1302. In some cases, increasing the distance between acoustic transducers 1320 of the microphone array may improve the accuracy of beam-forming performed via the microphone array. For example, if a sound is detected by acoustic transducers 1320(C) and 1320(D) and the distance between acoustic transducers 1320(C) and 1320(D) is greater than, e.g., the distance between acoustic transducers 1320(D) and 1320(E), the determined source location of the detected sound may be more accurate than if the sound had been detected by acoustic transducers 1320(D) and 1320(E).

Controller 1325 of neckband 1305 may process information generated by the sensors on neckband 1305 and/or augmented-reality system 1300. For example, controller 1325 may process information from the microphone array that describes sounds detected by the microphone array. For each detected sound, controller 1325 may perform a direction-of-arrival (DOA) estimation to estimate a direction from which the detected sound arrived at the microphone array. As the microphone array detects sounds, controller 1325 may populate an audio data set with the information. In embodiments in which augmented-reality system 1300 includes an inertial measurement unit, controller 1325 may compute all inertial and spatial calculations from the IMU located on eyewear device 1302. A connector may convey information between augmented-reality system 1300 and neckband 1305 and between augmented-reality system 1300 and controller 1325. The information may be in the form of optical data, electrical data, wireless data, or any other transmittable data form. Moving the processing of information generated by augmented-reality system 1300 to neckband 1305 may reduce weight and heat in eyewear device 1302, making it more comfortable to the user.

Power source 1335 in neckband 1305 may provide power to eyewear device 1302 and/or to neckband 1305. Power source 1335 may include, without limitation, lithium ion batteries, lithium-polymer batteries, primary lithium batteries, alkaline batteries, or any other form of power storage. In some cases, power source 1335 may be a wired power source. Including power source 1335 on neckband 1305 instead of on eyewear device 1302 may help better distribute the weight and heat generated by power source 1335.

As noted, some artificial-reality systems may, instead of blending an artificial reality with actual reality, substantially replace one or more of a user's sensory perceptions of the real world with a virtual experience. One example of this type of system is a head-worn display system, such as virtual-reality system 1400 in FIG. 14, that mostly or completely covers a user's field of view. Virtual-reality system 1400 may include a front rigid body 1402 and a band 1404 shaped to fit around a user's head. Virtual-reality system 1400 may also include output audio transducers 1406(A) and 1406(B). Furthermore, while not shown in FIG. 14, front rigid body 1402 may include one or more electronic elements, including one or more electronic displays, one or more inertial measurement units (IMUS), one or more tracking emitters or detectors, and/or any other suitable device or system for creating an artificial reality experience.

Artificial-reality systems may include a variety of types of visual feedback mechanisms. For example, display devices in augmented-reality system 1300 and/or virtual-reality system 1400 may include one or more liquid crystal displays (LCDs), light emitting diode (LED) displays, organic LED (OLED) displays, and/or any other suitable type of display screen. Artificial-reality systems may include a single display screen for both eyes or may provide a display screen for each eye, which may allow for additional flexibility for varifocal adjustments or for correcting a user's refractive error. Some artificial-reality systems may also include optical subsystems having one or more lenses (e.g., conventional concave or convex lenses, Fresnel lenses, adjustable liquid lenses, etc.) through which a user may view a display screen.

In addition to or instead of using display screens, some artificial-reality systems may include one or more projection systems. For example, display devices in augmented-reality system 1300 and/or virtual-reality system 1400 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial-reality content and the real world. Artificial-reality systems may also be configured with any other suitable type or form of image projection system.

Artificial-reality systems may also include various types of computer vision components and subsystems. For example, augmented-reality system 1200, augmented-reality system 1300, and/or virtual-reality system 1400 may include one or more optical sensors, such as two-dimensional (2D) or 3D cameras, time-of-flight depth sensors, single-beam or sweeping laser rangefinders, 3D LiDAR sensors, and/or any other suitable type or form of optical sensor.

An artificial-reality system may process data from one or more of these sensors to identify a location of a user, to map the real world, to provide a user with context about real-world surroundings, and/or to perform a variety of other functions.

Artificial-reality systems may also include one or more input and/or output audio transducers. In the examples shown in FIGS. 12 and 14, output audio transducers 1208(A), 1208(B), 1406(A), and 1406(B) may include voice coil speakers, ribbon speakers, electrostatic speakers, piezoelectric speakers, bone conduction transducers, cartilage conduction transducers, and/or any other suitable type or form of audio transducer. Similarly, input audio transducers 1210 may include condenser microphones, dynamic microphones, ribbon microphones, and/or any other type or form of input transducer. In some embodiments, a single transducer may be used for both audio input and audio output.

Figure 14:
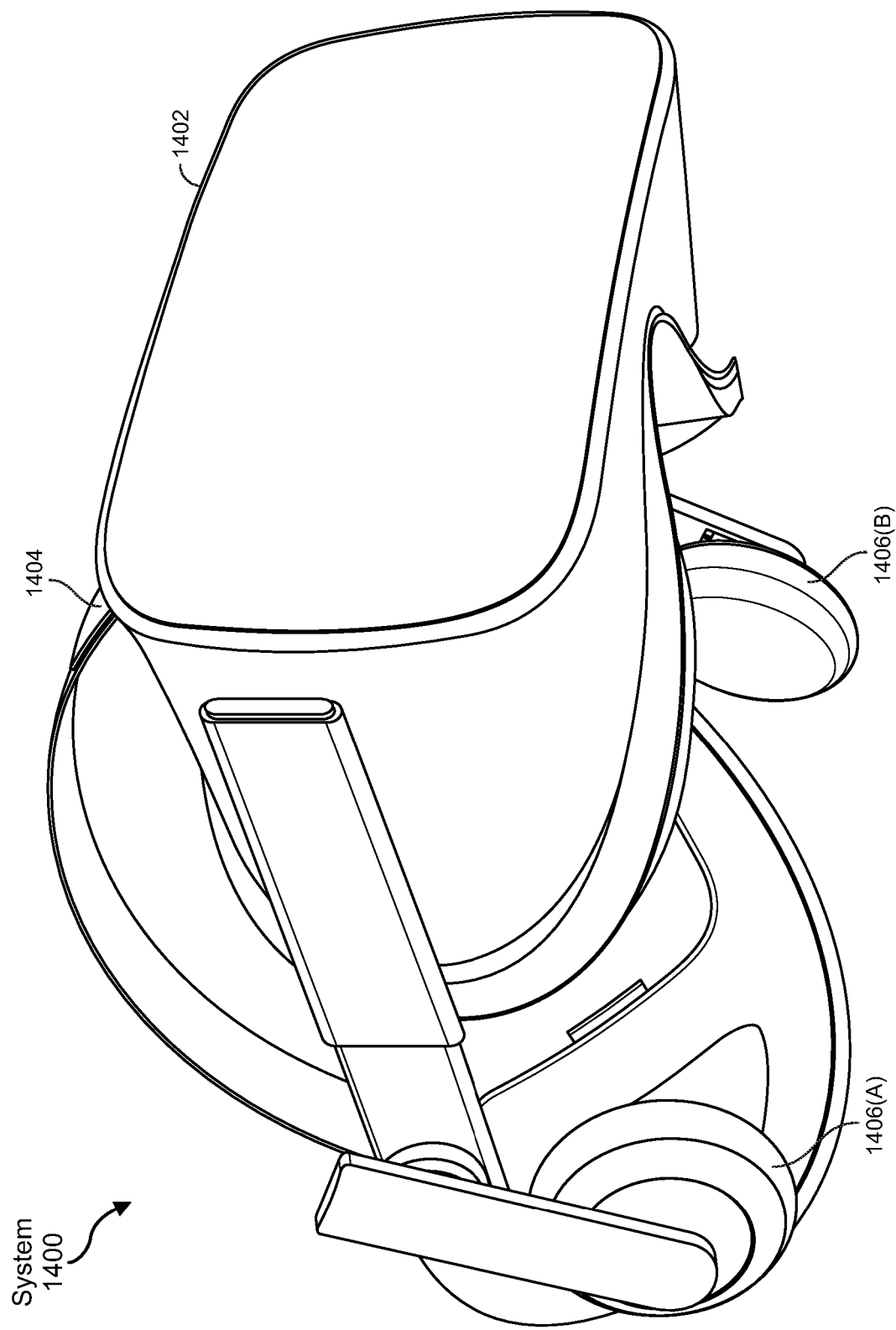
FIG. 14 is an illustration of an exemplary virtual-reality headset that may be used in connection with embodiments of this disclosure.

While not shown in FIGS. 12-14, artificial-reality systems may include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial-reality devices, within other artificial-reality devices, and/or in conjunction with other artificial-reality devices.

By providing haptic sensations, audible content, and/or visual content, artificial-reality systems may create an entire virtual experience or enhance a user's real-world experience in a variety of contexts and environments. For instance, artificial-reality systems may assist or extend a user's perception, memory, or cognition within a particular environment. Some systems may enhance a user's interactions with other people in the real world or may enable more immersive interactions with other people in a virtual world. Artificial-reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visuals aids, etc.). The embodiments disclosed herein may enable or enhance a user's artificial-reality experience in one or more of these contexts and environments and/or in other contexts and environments.

As noted, artificial-reality systems 1200, 1300, and 1400 may be used with a variety of other types of devices to provide a more compelling artificial-reality experience. These devices may be haptic interfaces with transducers that provide haptic feedback and/or that collect haptic information about a user's interaction with an environment. The artificial-reality systems disclosed herein may include various types of haptic interfaces that detect or convey various types of haptic information, including tactile feedback (e.g., feedback that a user detects via nerves in the skin, which may also be referred to as cutaneous feedback) and/or kinesthetic feedback (e.g., feedback that a user detects via receptors located in muscles, joints, and/or tendons).

Figure 15:
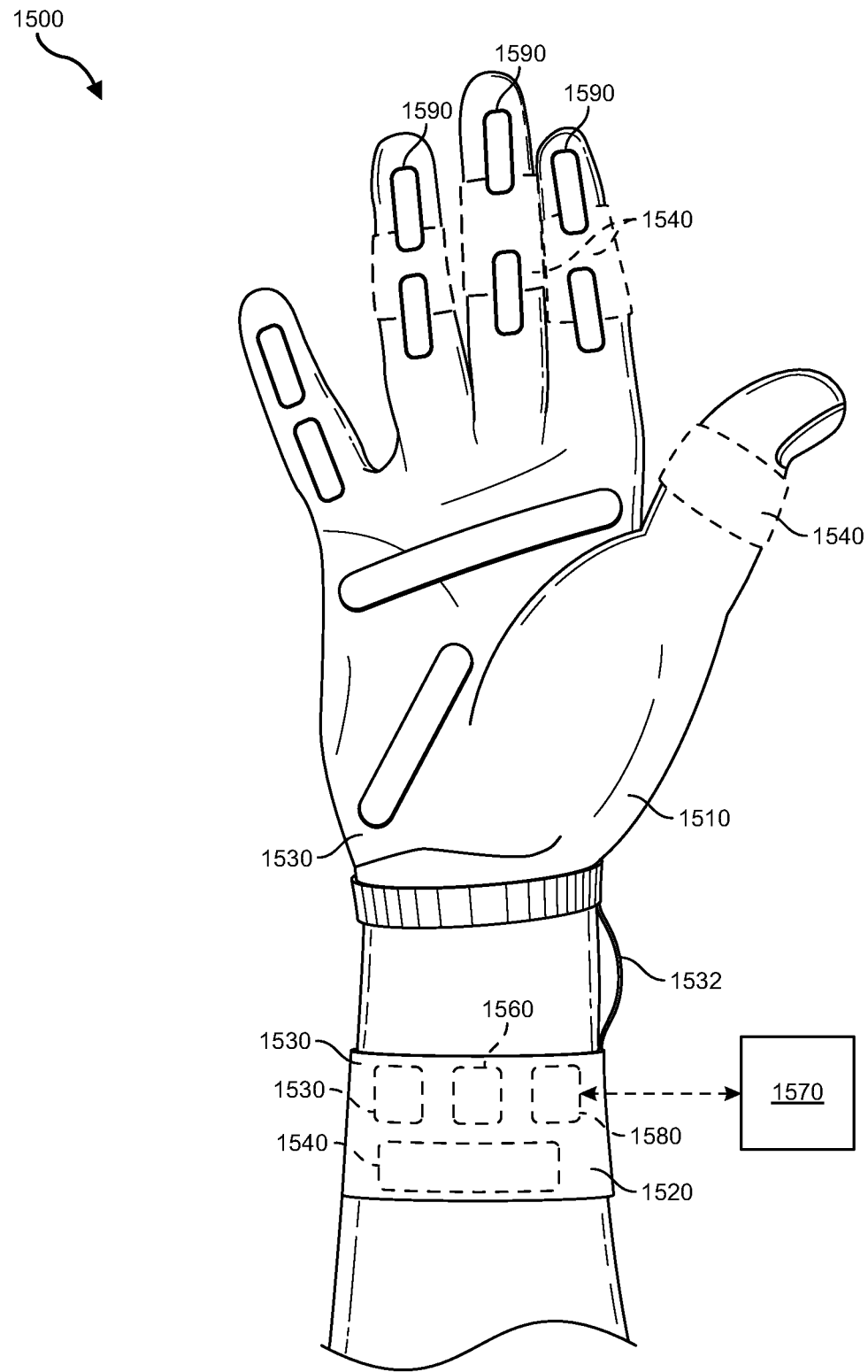
FIG. 15 is an illustration of exemplary haptic devices that may be used in connection with embodiments of this disclosure.

Haptic feedback may be provided by interfaces positioned within a user's environment (e.g., chairs, tables, floors, etc.) and/or interfaces on articles that may be worn or carried by a user (e.g., gloves, wristbands, etc.). As an example, FIG. 15 illustrates a vibrotactile system 1500 in the form of a wearable glove (haptic device 1510) and wristband (haptic device 1520). Haptic device 1510 and haptic device 1520 are shown as examples of wearable devices that include a flexible, wearable textile material 1530 that is shaped and configured for positioning against a user's hand and wrist, respectively. This disclosure also includes vibrotactile systems that may be shaped and configured for positioning against other human body parts, such as a finger, an arm, a head, a torso, a foot, or a leg. By way of example and not limitation, vibrotactile systems according to various embodiments of the present disclosure may also be in the form of a glove, a headband, an armband, a sleeve, a head covering, a sock, a shirt, or pants, among other possibilities. In some examples, the term "textile" may include any flexible, wearable material, including woven fabric, non-woven fabric, leather, cloth, a flexible polymer material, composite materials, etc.

One or more vibrotactile devices 1540 may be positioned at least partially within one or more corresponding pockets formed in textile material 1530 of vibrotactile system 1500. Vibrotactile devices 1540 may be positioned in locations to provide a vibrating sensation (e.g., haptic feedback) to a user of vibrotactile system 1500. For example, vibrotactile devices 1540 may be positioned to be against the user's finger(s), thumb, or wrist, as shown in FIG. 15. Vibrotactile devices 1540 may, in some examples, be sufficiently flexible to conform to or bend with the user's corresponding body part(s).

A power source 1550 (e.g., a battery) for applying a voltage to the vibrotactile devices 1540 for activation thereof may be electrically coupled to vibrotactile devices 1540, such as via conductive wiring 1552. In some examples, each of vibrotactile devices 1540 may be independently electrically coupled to power source 1550 for individual activation. In some embodiments, a processor 1560 may be operatively coupled to power source 1550 and configured (e.g., programmed) to control activation of vibrotactile devices 1540.

Vibrotactile system 1500 may be implemented in a variety of ways. In some examples, vibrotactile system 1500 may be a standalone system with integral subsystems and components for operation independent of other devices and systems. As another example, vibrotactile system 1500 may be configured for interaction with another device or system 1570. For example, vibrotactile system 1500 may, in some examples, include a communications interface 1580 for receiving and/or sending signals to the other device or system 1570. The other device or system 1570 may be a mobile device, a gaming console, an artificial-reality (e.g., virtual-reality, augmented-reality, mixed-reality) device, a personal computer, a tablet computer, a network device (e.g., a modem, a router, etc.), a handheld controller, etc. Communications interface 1580 may enable communications between vibrotactile system 1500 and the other device or system 1570 via a wireless (e.g., Wi-Fi, Bluetooth, cellular, radio, etc.) link or a wired link. If present, communications interface 1580 may be in communication with processor 1560, such as to provide a signal to processor 1560 to activate or deactivate one or more of the vibrotactile devices 1540.

Vibrotactile system 1500 may optionally include other subsystems and components, such as touch-sensitive pads 1590, pressure sensors, motion sensors, position sensors, lighting elements, and/or user interface elements (e.g., an on/off button, a vibration control element, etc.). During use, vibrotactile devices 1540 may be configured to be activated for a variety of different reasons, such as in response to the user's interaction with user interface elements, a signal from the motion or position sensors, a signal from the touch-sensitive pads 1590, a signal from the pressure sensors, a signal from the other device or system 1570, etc.

Although power source 1550, processor 1560, and communications interface 1580 are illustrated in FIG. 15 as being positioned in haptic device 1520, the present disclosure is not so limited. For example, one or more of power source 1550, processor 1560, or communications interface 1580 may be positioned within haptic device 1510 or within another wearable textile.

Figure 16:
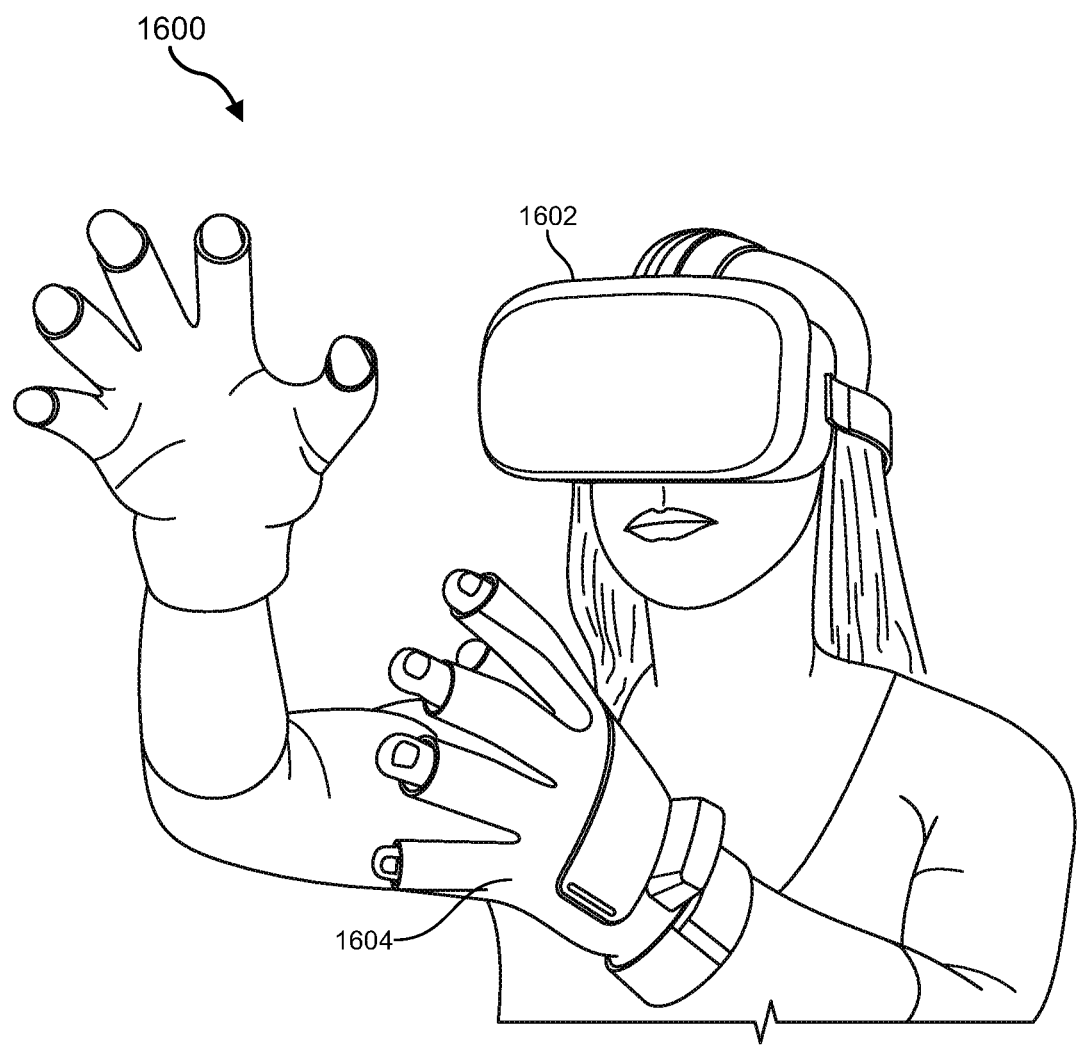
FIG. 16 is an illustration of an exemplary virtual-reality environment according to embodiments of this disclosure.

Haptic wearables, such as those shown in and described in connection with FIG. 15, may be implemented in a variety of types of artificial-reality systems and environments. FIG. 16 shows an example artificial-reality environment 1600 including one head-mounted virtual-reality display and two haptic devices (i.e., gloves), and in other embodiments any number and/or combination of these components and other components may be included in an artificial-reality system. For example, in some embodiments there may be multiple head-mounted displays each having an associated haptic device, with each head-mounted display and each haptic device communicating with the same console, portable computing device, or other computing system.

Head-mounted display 1602 generally represents any type or form of virtual-reality system, such as virtual-reality system 1400 in FIG. 14. Haptic device 1604 generally represents any type or form of wearable device, worn by a use of an artificial-reality system, that provides haptic feedback to the user to give the user the perception that he or she is physically engaging with a virtual object. In some embodiments, haptic device 1604 may provide haptic feedback by applying vibration, motion, and/or force to the user. For example, haptic device 1604 may limit or augment a user's movement. To give a specific example, haptic device 1604 may limit a user's hand from moving forward so that the user has the perception that his or her hand has come in physical contact with a virtual wall. In this specific example, one or more actuators within the haptic advice may achieve the physical-movement restriction by pumping fluid into an inflatable bladder of the haptic device. In some examples, a user may also use haptic device 1604 to send action requests to a console. Examples of action requests include, without limitation, requests to start an application and/or end the application and/or requests to perform a particular action within the application.

Figure 17:
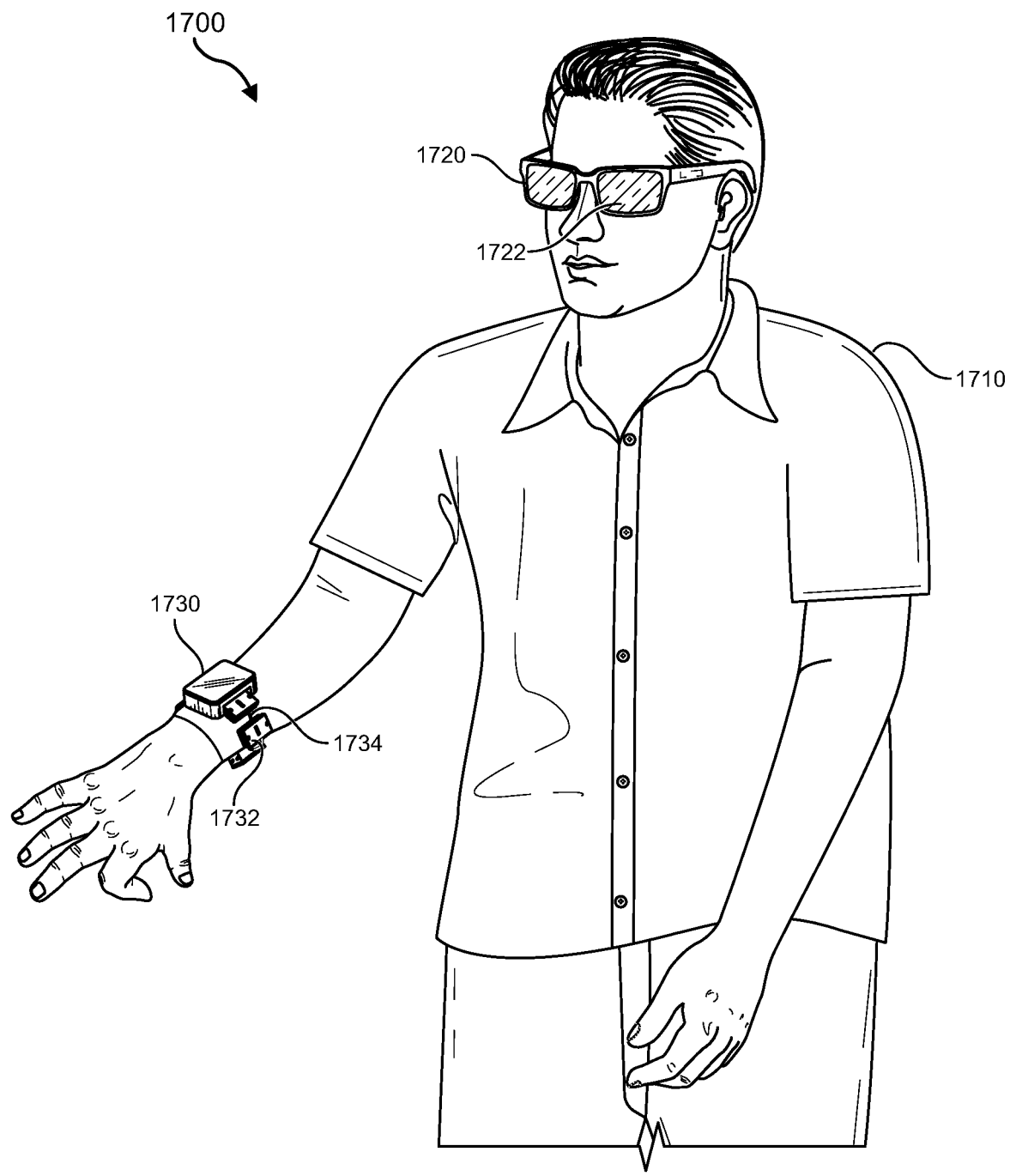
FIG. 17 is an illustration of an exemplary augmented-reality environment according to embodiments of this disclosure.

While haptic interfaces may be used with virtual-reality systems, as shown in FIG. 16, haptic interfaces may also be used with augmented-reality systems, as shown in FIG. 17. FIG. 17 is a perspective view a user 1710 interacting with an augmented-reality system 1700. In this example, user 1710 may wear a pair of augmented-reality glasses 1720 that have one or more displays 1722 and that are paired with a haptic device 1730. Haptic device 1730 may be a wristband that includes a plurality of band elements 1732 and a tensioning mechanism 1734 that connects band elements 1732 to one another.

One or more of band elements 1732 may include any type or form of actuator suitable for providing haptic feedback. For example, one or more of band elements 1732 may be configured to provide one or more of various types of cutaneous feedback, including vibration, force, traction, texture, and/or temperature. To provide such feedback, band elements 1732 may include one or more of various types of actuators. In some embodiments, an actuator may include a layer of nanovoided polymer sandwiched between conductive electrodes. In one example, each of band elements 1732 may include a vibrotactor (e.g., a vibrotactile actuator) configured to vibrate in unison or independently to provide one or more of various types of haptic sensations to a user. Alternatively, only a single band element or a subset of band elements may include vibrotactors.

Haptic devices 1510, 1520, 1604, and 1730 may include any suitable number and/or type of haptic transducer, sensor, and/or feedback mechanism. For example, haptic devices 1510, 1520, 1604, and 1730 may include one or more mechanical transducers, piezoelectric transducers, and/or fluidic transducers. Haptic devices 1510, 1520, 1604, and 1730 may also include various combinations of different types and forms of transducers that work together or independently to enhance a user's artificial-reality experience. In one example, each of band elements 1732 of haptic device 1730 may include a vibrotactor (e.g., a vibrotactile actuator) configured to vibrate in unison or independently to provide one or more of various types of haptic sensations to a user.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An optical transformer comprising:
    a light source comprising an addressable array of a plurality of emitters; and
    an array of photovoltaic cells optically coupled to the light source, wherein:
        at least a portion of the photovoltaic cells are connected in series; and
        each emitter within the addressable array of emitters is configured to independently switch on or off to selectively illuminate an individual photovoltaic cell, respectively, within the array of photovoltaic cells.

2. The optical transformer of claim 1, wherein the light source comprises a surface-emitting device or an edge-emitting device.

3. The optical transformer of claim 1, wherein the light source comprises a laser or a light-emitting diode.

4. The optical transformer of claim 1, wherein the light source further comprises an optical element adapted to focus light generated by the light source.

5. The optical transformer of claim 1, wherein an emission spectrum of the light source at least partially overlaps an absorption profile of the array of photovoltaic cells.

6. The optical transformer of claim 1, further comprising a cooling element configured to control a temperature of the light source.

7. The optical transformer of claim 1, wherein the photovoltaic cells comprise a direct bandgap compound semiconductor.

8. The optical transformer of claim 1, wherein the photovoltaic cells comprise at least one structure selected from the group consisting of a p-n junction, a Schottky diode, a quantum well, and a quantum dot.

9. The optical transformer of claim 1, wherein at least a portion of the photovoltaic cells are connected in parallel.

10. The optical transformer of claim 1, wherein the array of photovoltaic cells comprises one or more bypass diodes.

11. The optical transformer of claim 1, wherein the photovoltaic cells are disposed within multiple sub-arrays each having a voltage output port.

12. The optical transformer of claim 1, further comprising an optical connector disposed between an output of the light source and an input of the array of photovoltaic cells.

13. The optical transformer of claim 1, wherein a volume of the optical transformer is less than approximately 5 mm$^3$.

14. The optical transformer of claim 1, wherein an inter-cell distance between each photovoltaic cell within the array of photovoltaic cells is variable.

15. An actuation system comprising:
    an optical transformer comprising a light source, wherein the light source comprises an addressable array of a plurality of emitters; and
    a serial array of photovoltaic cells optically coupled to the light source, wherein each emitter within the addressable array of emitters is configured to independently switch on or off to selectively illuminate an individual photovoltaic cell, respectively, within the serial array of photovoltaic cells; and
    an actuator comprising a primary electrode, a secondary electrode overlapping at least a portion of the primary electrode, and an electroactive layer disposed between and abutting the primary electrode and the secondary electrode, wherein the primary electrode is electrically connected to an output of the optical transformer.

16. The actuation system of claim 15, wherein the optical transformer is mounted on the actuator.

17. A method comprising:
    applying an input voltage to a light source to form rays of electromagnetic radiation, wherein the light source comprises an addressable array of a plurality of emitters; and
    illuminating the electromagnetic radiation onto a serial array of photovoltaic cells, wherein each emitter within the addressable array of emitters is configured to independently switch on or off to selectively illuminate an individual photovoltaic cell, respectively, within the serial array of photovoltaic cells.

18. The method of claim 17, wherein the light source comprises an array of emitters and the input voltage is applied to a subset of the emitters.

19. The method of claim 17, wherein illuminating the array of photovoltaic cells comprises directing the electromagnetic radiation through an optical connector disposed between an output of the light source and an input of the array of photovoltaic cells.

20. The method of claim 17, wherein the light source is controlled by current modulation or voltage modulation.

* * * * *